(12) United States Patent
Tai et al.

(10) Patent No.: US 12,336,199 B2
(45) Date of Patent: Jun. 17, 2025

(54) SEMICONDUCTOR DEVICES AND METHODS FOR INCREASED CAPACITANCE

(71) Applicant: Taiwan Semiconductor Manufacturing Company, Ltd., Hsinchu (TW)

(72) Inventors: Cheng-You Tai, Taipei (TW); Ling-Sung Wang, Tainan (TW); Ru-Shang Hsiao, Jhubei (TW); Jung-Chi Jeng, Tainan (TW); Sung-Hsin Yang, Tainan (TW); Tsung Jing Wu, Yunlin County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/699,300

(22) Filed: Mar. 21, 2022

(65) Prior Publication Data
US 2023/0299213 A1    Sep. 21, 2023

(51) Int. Cl.
*H01L 21/265* (2006.01)
*H10D 1/00* (2025.01)
*H10D 1/66* (2025.01)

(52) U.S. Cl.
CPC ......... *H10D 1/66* (2025.01); *H01L 21/26513* (2013.01); *H10D 1/047* (2025.01)

(58) Field of Classification Search
None
See application file for complete search history.

(56) References Cited

U.S. PATENT DOCUMENTS

| | | | |
|---|---|---|---|
| 2005/0186746 A1 | 8/2005 | Lee et al. | |
| 2006/0234451 A1* | 10/2006 | Slesazeck | H01L 29/6656 |
| | | | 257/E21.429 |
| 2009/0026530 A1* | 1/2009 | Wilson | H01L 21/76224 |
| | | | 257/E21.409 |
| 2011/0147848 A1* | 6/2011 | Kuhn | H01L 21/823431 |
| | | | 257/E21.546 |
| 2014/0299928 A1 | 10/2014 | Oyu et al. | |
| 2015/0287829 A1 | 10/2015 | Kim et al. | |
| 2016/0104704 A1* | 4/2016 | Fang | H01L 29/4238 |
| | | | 438/275 |
| 2016/0308027 A1* | 10/2016 | Chang | H01L 29/66795 |
| 2017/0170300 A1* | 6/2017 | Chang | H01L 29/6656 |
| 2017/0207129 A1* | 7/2017 | Tseng | H01L 29/0653 |
| 2019/0148550 A1* | 5/2019 | Cheng | H01L 29/7846 |
| | | | 257/369 |
| 2020/0044075 A1* | 2/2020 | Hu | H01L 21/76232 |
| 2022/0238673 A1* | 7/2022 | Huang | H01L 29/42364 |

FOREIGN PATENT DOCUMENTS

| | | |
|---|---|---|
| TW | 200947705 A1 | 11/2009 |
| TW | 202145571 A | 12/2021 |
| WO | WO 2010/150429 A1 * | 12/2010 |

* cited by examiner

*Primary Examiner* — Xiaoming Liu
(74) *Attorney, Agent, or Firm* — Lippes Mathias LLPx

(57) ABSTRACT

Semiconductor devices having increased capacitance without increased fin height or increased chip area are disclosed. Grooves are formed across a width of the fin(s) to increase the overlapping surface area with the gate terminal, in particular with a length of the groove being less than or equal to the fin width. Methods of forming such grooved fins and semiconductor capacitor devices are also described.

20 Claims, 30 Drawing Sheets

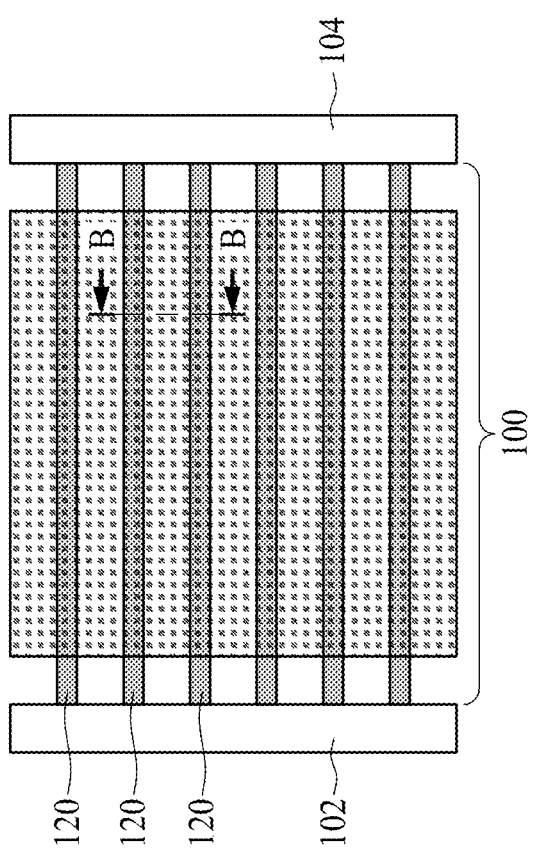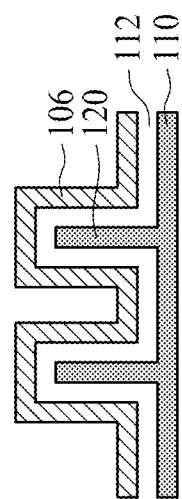
FIG. 1A
FIG. 1B

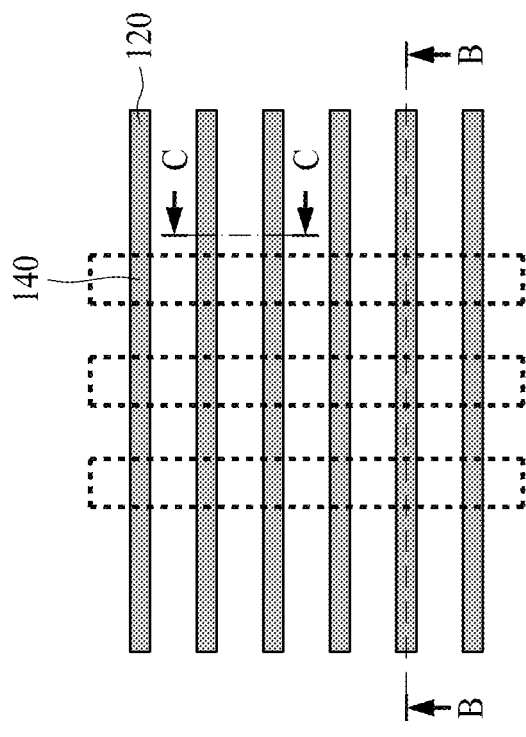
FIG. 16A
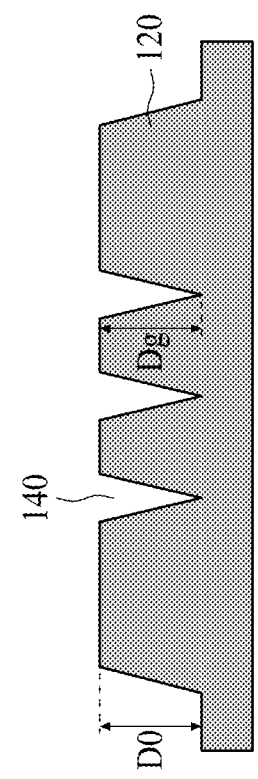
FIG. 16B
FIG. 16C

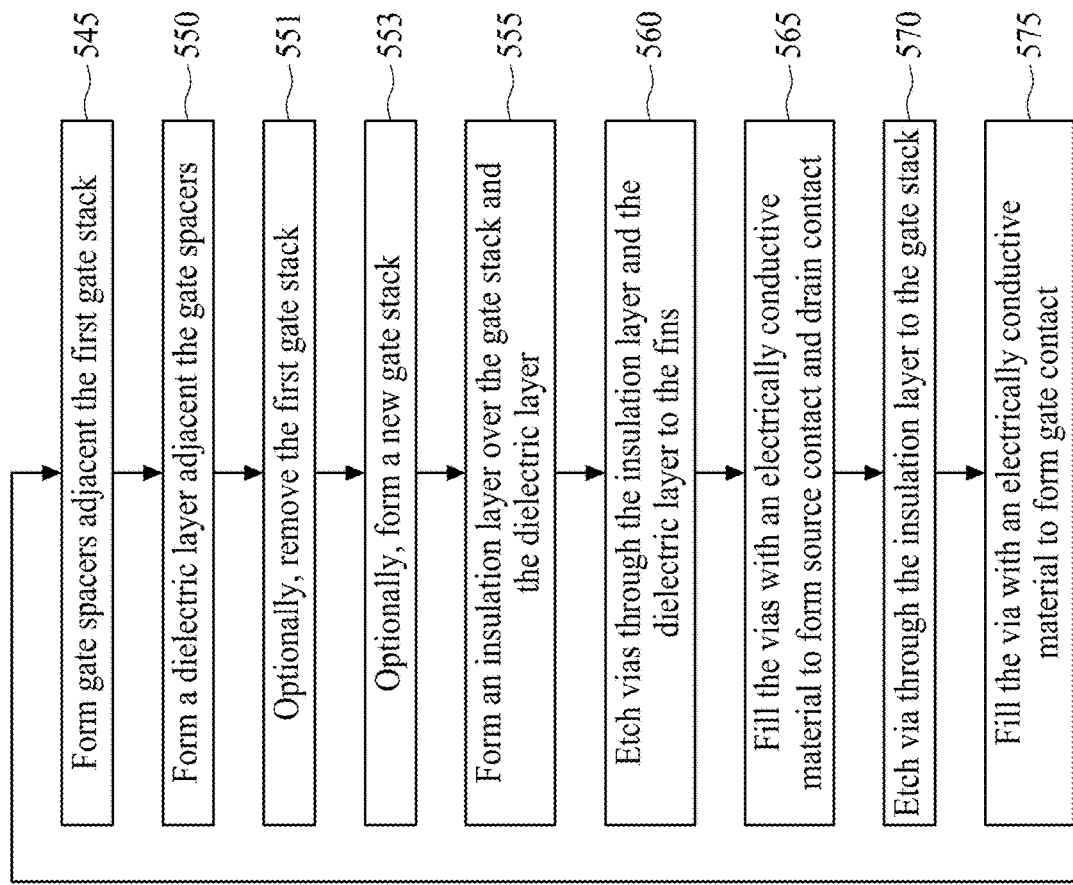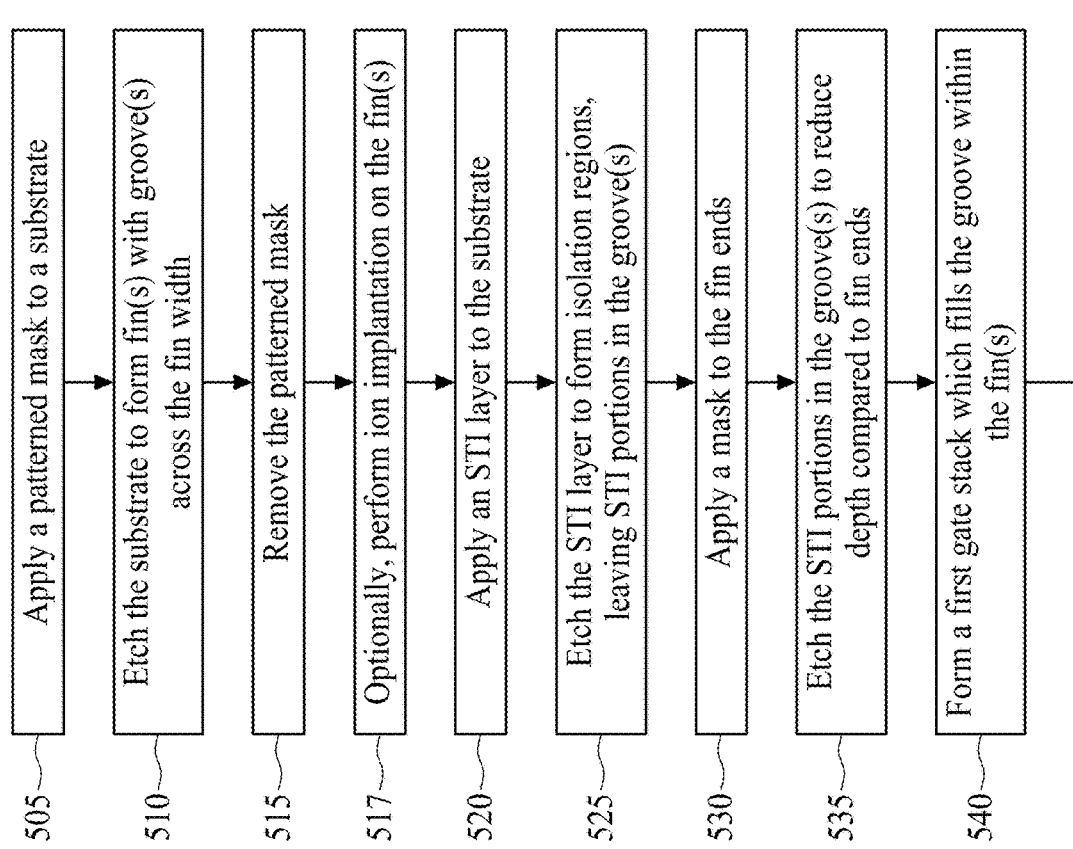
FIG. 21

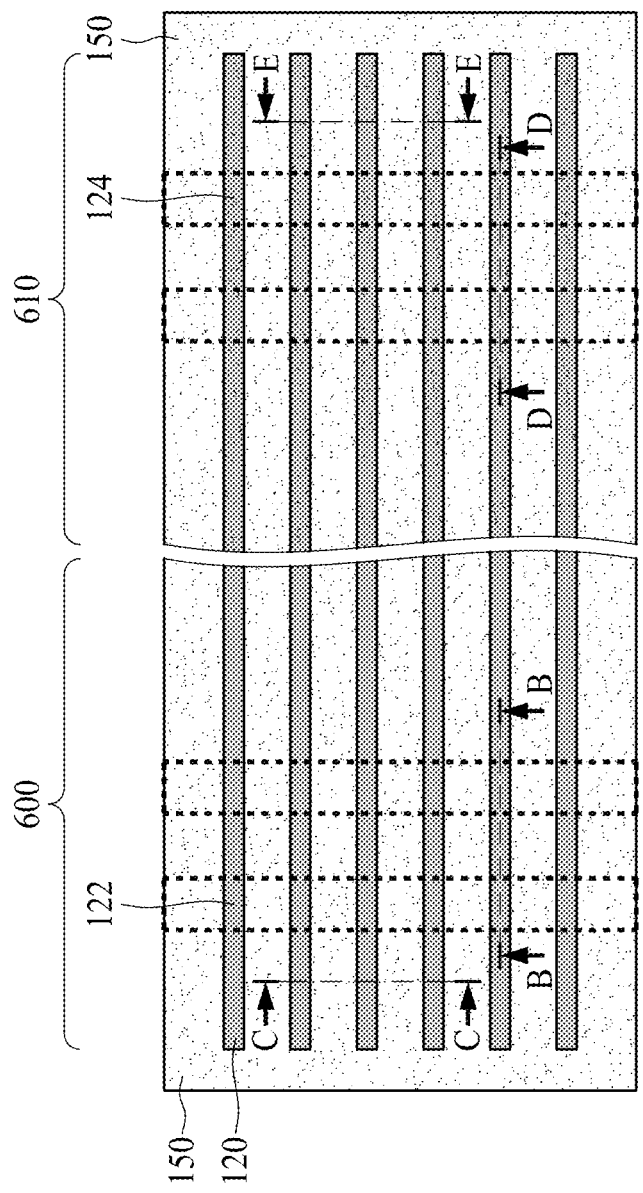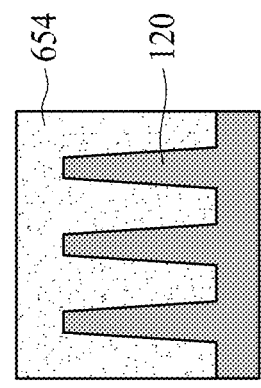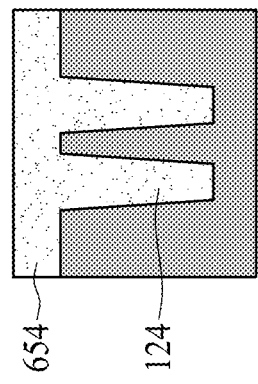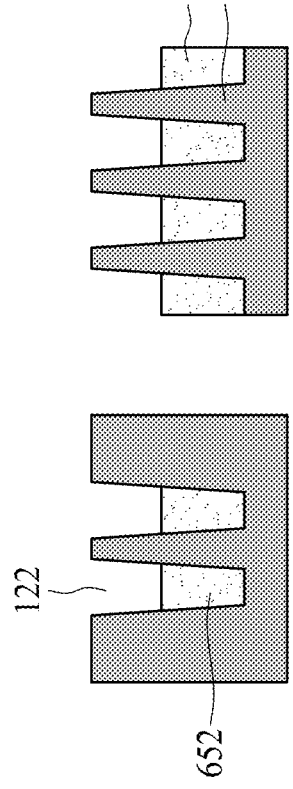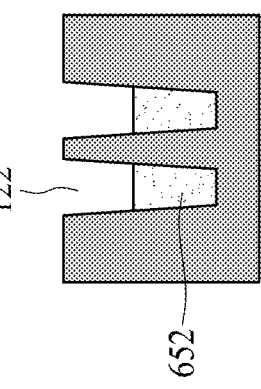

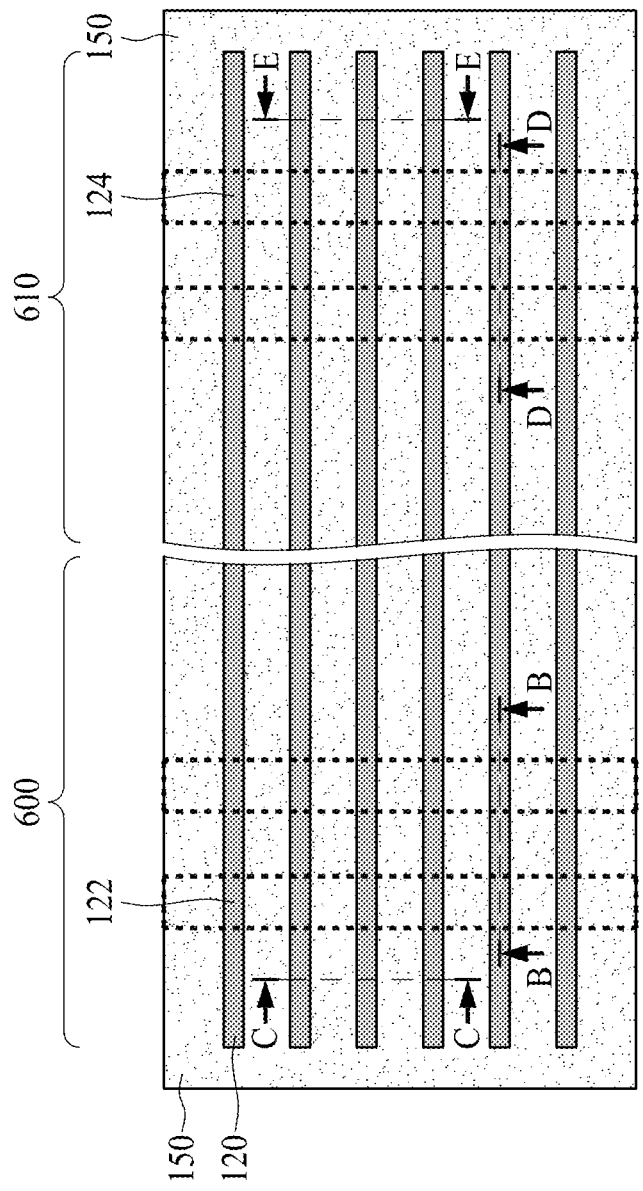
FIG. 26A
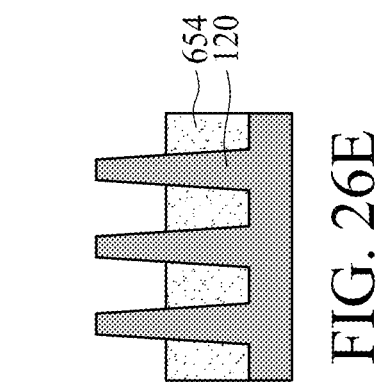
FIG. 26B
FIG. 26C
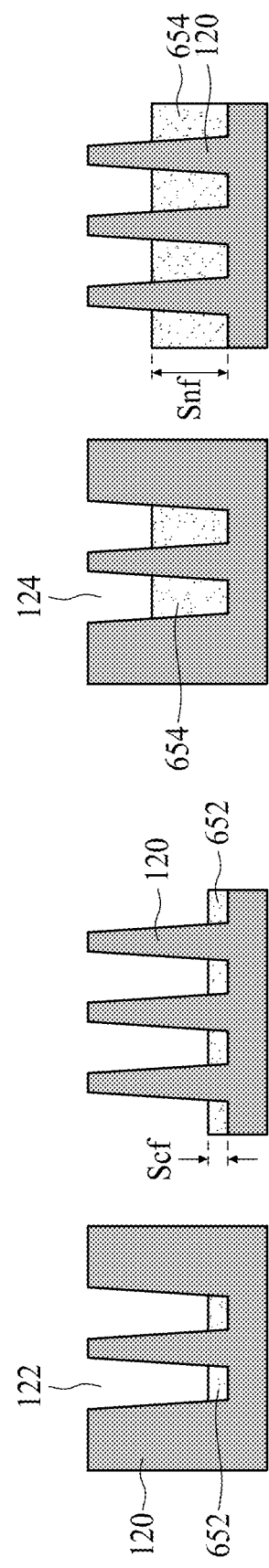
FIG. 26D
FIG. 26E

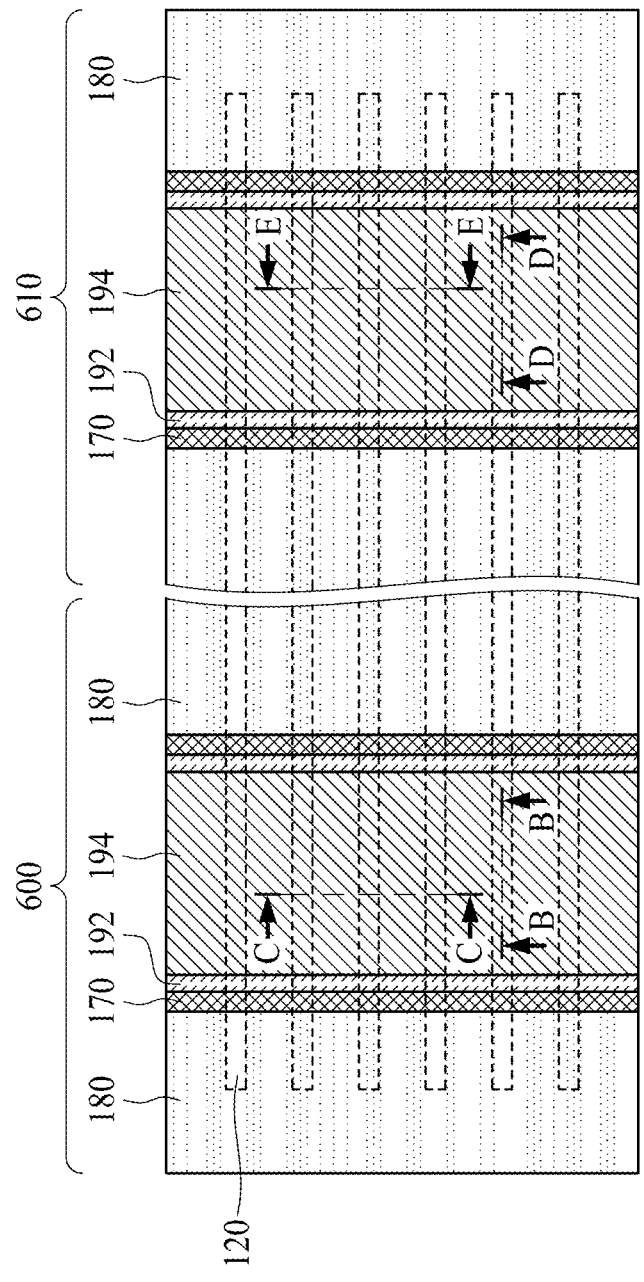
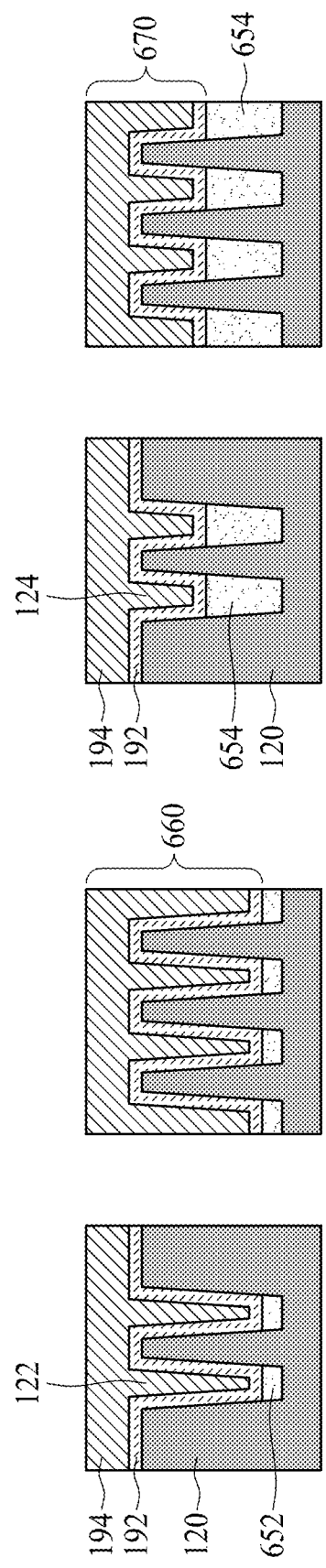
FIG. 27A
FIG. 27B
FIG. 27C
FIG. 27D
FIG. 27E

SEMICONDUCTOR DEVICES AND METHODS FOR INCREASED CAPACITANCE

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a plan view of a fin field effect transistor (FinFET), in accordance with some embodiments.

FIG. 1B is a lateral side cross-sectional view along line B-B of FIG. 1A.

FIG. 16A is a plan view showing the grooved fins after the mask has been removed.

FIG. 16B is a longitudinal side cross-sectional view along line B-B of FIG. 16A.

FIG. 16C is a lateral side cross-sectional view along line C-C of FIG. 16A.

FIG. 21 is a flowchart showing the steps in a second method for forming a semiconductor device, in accordance with some embodiments herein.

FIG. 25A is a plan view of the set of grooved fins, after the mask has been removed from the normal region.

FIG. 25B is a longitudinal side cross-sectional view of the capacitor region along line B-B of FIG. 25A.

FIG. 25C is a lateral side cross-sectional view of the capacitor region along line C-C of FIG. 25A.

FIG. 25D is a longitudinal side cross-sectional view of the normal region along line D-D of FIG. 25A.

FIG. 25E is a lateral side cross-sectional view of the normal region along line E-E of FIG. 25A.

FIG. 26A is a plan view of the set of grooved fins, after a subsequent second etching that reduces the depth of the STI layer in both the capacitor region and the normal region, exposing different amounts of the fins in each region.

FIG. 26B is a longitudinal side cross-sectional view of the capacitor region along line B-B of FIG. 26A.

FIG. 26C is a lateral side cross-sectional view of the capacitor region along line C-C of FIG. 26A.

FIG. 26D is a longitudinal side cross-sectional view of the normal region along line D-D of FIG. 26A.

FIG. 26E is a lateral side cross-sectional view of the normal region along line E-E of FIG. 26A.

FIG. 27A is a plan view of a third embodiment of a completed transistor, after formation of separate gate stacks in the two regions, gate spacers, and a dielectric layer, in accordance with some embodiments.

FIG. 27B is a longitudinal side cross-sectional view of the capacitor region along line B-B of FIG. 27A.

FIG. 27C is a lateral side cross-sectional view of the capacitor region along line C-C of FIG. 27A.

FIG. 27D is a longitudinal side cross-sectional view of the normal region along line D-D of FIG. 27A.

FIG. 27E is a lateral side cross-sectional view of the normal region along line E-E of FIG. 27A.

DETAILED DESCRIPTION

Figure 2A:
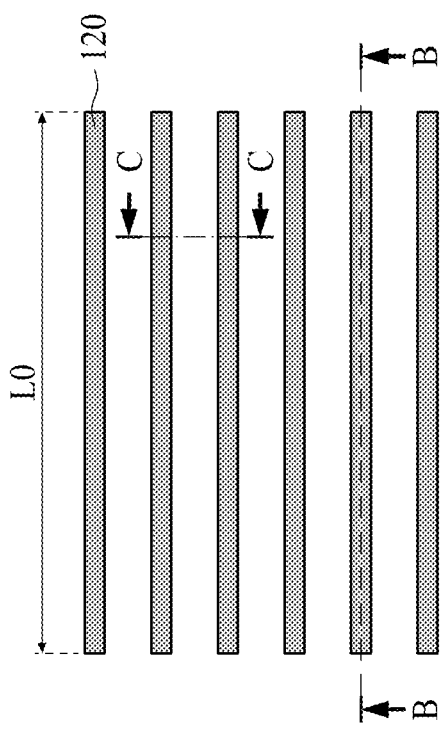
FIG. 2A is a plan view of a set of fins, showing an initial state, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The figures may provide views of fins across three different axes. The "plan view" is designated as being along the z-axis such that the length and width of the fin are visible, with the height extending into the page.

The "longitudinal side cross-sectional view" is arbitrarily designated as being along the x-axis such that the length and depth/height of the fin are visible, with the width extending into the page.

The "lateral side cross-sectional view" is arbitrarily designated as being along the y-axis such that the width and depth/height of the fin are visible, with the length extending into the page.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to semiconductor devices and methods for improving the performance of such devices. One type of three-dimensional design for a semiconductor device is a fin field effect transistor (FinFET), which is illustrated in plan view in FIGS. 1A and 1n cross-sectional view in FIG. 1B. Referring first to FIG. 1A, the channel 100 between the source terminal 102 and the drain terminal 104 is in the form of thin vertical fins 120. The source terminal 102 and the drain terminal 104 are illustrated as being in the same layer as the fins 120, but can be located elsewhere (for example above the fins), depending on the three-dimensional design of the transistor/semiconductor device. It is common for a single FinFET to use several fins in parallel, covered by the same gate terminal. As better seen in FIG. 1B, the fin(s) 120 are formed from the same material as the substrate 110. A dielectric layer 112 is then applied to the surfaces of the fins, and a conductive gate terminal 106 is thus present on three sides of each fin 120.

The structure of the gate terminal 106 being separated from the fin/channel 120 by the dielectric layer 112 creates a capacitor. The capacitance is proportional to the overlapping surface area between the gate terminal and the fins. Thus, the capacitance can be increased by increasing the surface area of the gate terminal, or by increasing the height of the fins. However, when increasing the surface area of the gate terminal, the total area of the overall semiconductor device/chip may be increased as well, which is not desirable. Simply increasing the height of the fins can decrease their stability, causing undesirable cracking.

The present disclosure thus relates to semiconductor capacitor devices with increased capacitance without increasing the total area of the overall semiconductor device or increasing the height of the fins, and to methods for making such devices. The increased capacitance is obtained by forming one or more grooves across the width of the fins, or in other words by cutting into the fins. This increases the total overlapping surface area between the fins and the gate terminal, without increasing the height of the fin. This structure thus has a high capacitance density. This also permits the capacitance to be independently controlled without changing the fin height.

FIGS. 2A-12C illustrate a first method for forming such a semiconductor device, in accordance with some embodiments. It is noted that for clarity, the plan views do not include the areas between fins, although those areas are included in the longitudinal side cross-sectional views and the lateral side cross-sectional views. FIG. 13 is a flowchart summarizing the various steps in the first method, and will be further discussed after FIGS. 2A-12C.

Figure 2B:
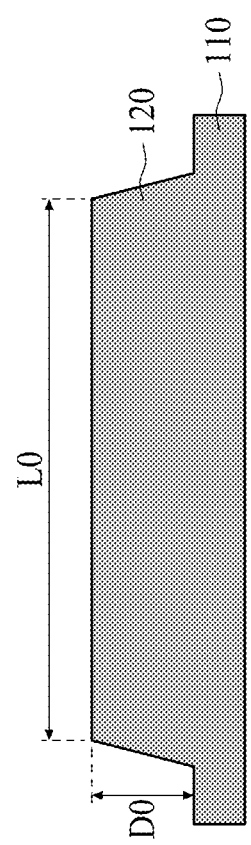
FIG. 2B is a longitudinal side cross-sectional view along line B-B of FIG. 2A.
Figure 2C:
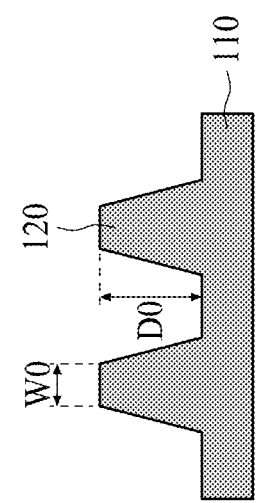
FIG. 2C is a lateral side cross-sectional view along line C-C of FIG. 2A.

Referring first to FIGS. 2A-2C, the fins 120 are illustrated here in an initial state. Each fin has an initial length L0, an initial width W0, and an initial depth or height D0. Although a rectangular shape is ideal for the fin, as can be seen in FIG. 2B and FIG. 2C, the fin may also have a generally trapezoidal cross-section, with potentially rounded sides and/or edges. The initial length L0 and the initial width W0 are measured at the top of the fin. The initial depth D0 is also measured from the top of the fin.

In general embodiments, the initial fin length L0 may range from about 20 nm to about 1200 nm. In general embodiments, the initial fin width W0 may range from about 4 nm to about 20 nm. In general embodiments, the initial fin depth D0 may range from about 10 nm to about 80 nm. Combinations of these ranges are contemplated.

The wafer substrate and the fins can be made of any semiconducting material. Such materials can include silicon, for example in the form of crystalline Si or polycrystalline Si. In alternative embodiments, the substrate and fins can be made of other elementary semiconductors such as germanium, or may include a compound semiconductor such as silicon carbide (SiC), gallium arsenide (GaAs), indium arsenide (InAs), and indium phosphide (InP).

The fins 120 may be formed by any appropriate process. For example, self-aligned double patterning (SADP) or self-aligned quadruple patterning (SAQP) can be used to form the fins. Briefly, a hard mask is deposited upon the substrate and then patterned to form a mandrel. Next, a spacer is formed by deposition upon the horizontal and vertical surfaces of the mandrel. The horizontal surfaces of the spacer are then etched, leaving only the spacer on the two vertical surfaces of the mandrel. The mandrel is then removed, leaving only the two vertical spacers. This doubles the line density upon the substrate (i.e. SADP) compared to the original pattern, or halves the line pitch. These SADP steps can be repeated using the two vertical spacers as a new mandrel to halve the pitch again (i.e. SAQP). The spacers are then used as a mask to perform etching of the substrate and obtain the fins.

Figure 3C:
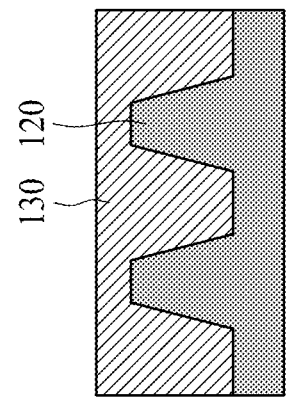
FIG. 3C is a lateral side cross-sectional view along line C-C of FIG. 3A.
Figure 3A:
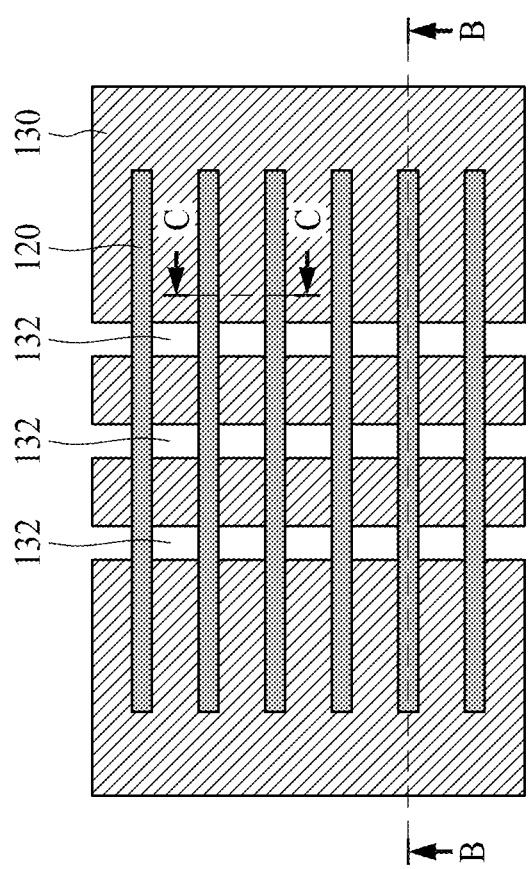
FIG. 3A is a plan view of the set of fins, showing a mask applied to form grooves in the fins.
Figure 3B:
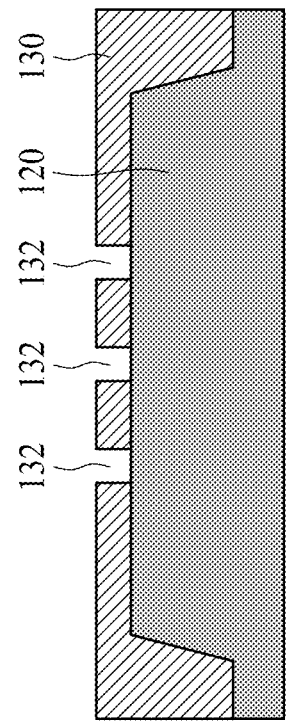
FIG. 3B is a longitudinal side cross-sectional view along line B-B of FIG. 3A.

Referring next to FIGS. 3A-3C, a patterned mask 130 is applied to the fins 120. The mask is typically formed using photoresist, although a hard mask material, such as a nitride, could also be used. As illustrated here by way of example, the fins are exposed in three areas 132, which will correspond to grooves that are formed across the width of each fin. The fins are then etched to form the grooves. This may be done, for example, using wet etching processes, dry etching processes, or plasma etching.

Figure 4C:
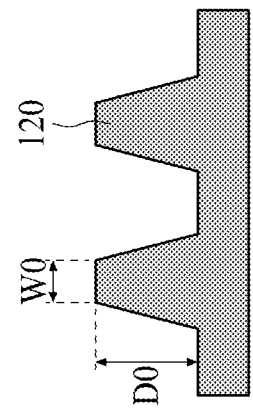
FIG. 4C is a lateral side cross-sectional view along line C-C of FIG. 4A.
Figure 4A:
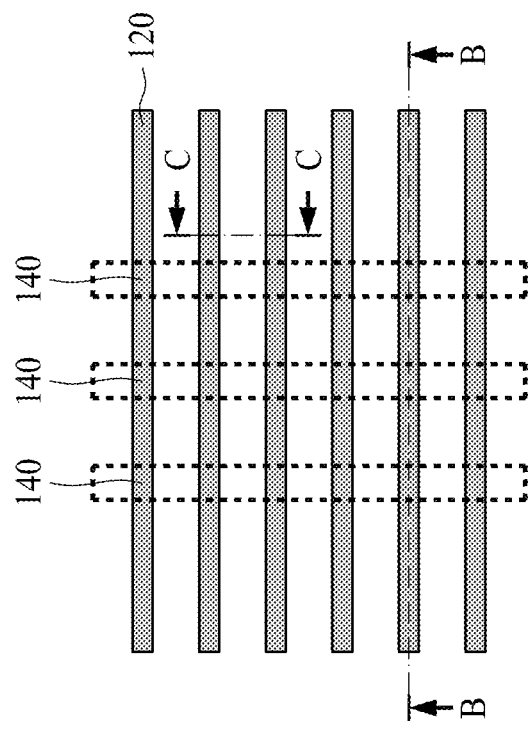
FIG. 4A is a plan view of the set of fins, showing the fins with grooves formed across a width thereof.
Figure 4B:
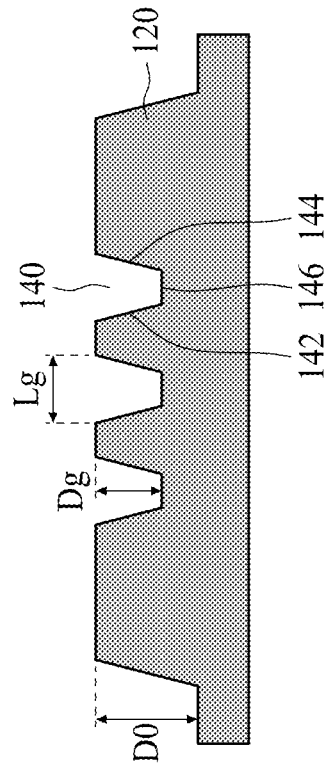
FIG. 4B is a longitudinal side cross-sectional view along line B-B of FIG. 4A, illustrating a groove with a trapezoidal cross-section.
Figure 4D:
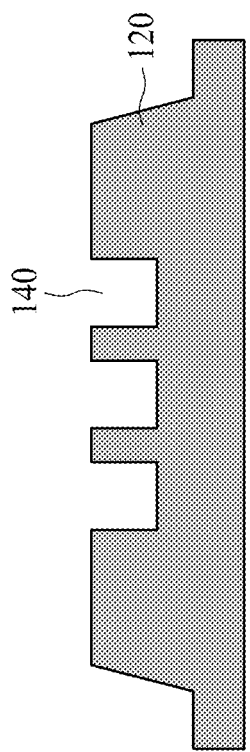
FIG. 4D is an alternative longitudinal side cross-sectional view showing a groove with a rectangular cross-section.
Figure 4E:
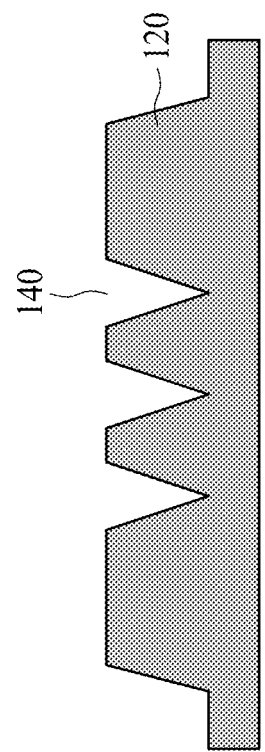
FIG. 4E is an alternative longitudinal side cross-sectional view showing a groove with a triangular cross-section.

Referring now to FIGS. 4A-4C, the patterned mask has been removed, and the etched fin 120 with fin cuts or grooves is shown. In the plan view of FIG. 4A, dotted rectangles are used to indicate the location of the grooves 140 on the fins 120.

As illustrated here, three grooves 140 are formed which extend across the width of the fin structure. The length, width, and depth of each groove is measured in the same direction as the length, width, and depth of the fin. The three grooves have the same depth, which is indicated as depth Dg. The initial fin depth D0 is also shown. In particular embodiments, the groove depth Dg can be deeper or shallower than the initial fin depth D0. Put another way, Dg can be greater than or less than D0. In particular embodiments, and as illustrated here, Dg is less than D0.

The length and depth of the grooves can differ between each other, which is determined by the patterned mask. For illustrative purposes, the length of one groove at the top of the fin is indicated as length Lg. When Lg is less than or equal to W0, there are multiple combinations of groove length and groove depth for which the surface area within the new groove is greater than the surface area of the portion of the original fin which was removed to form the groove. As a result, then, the capacitance can be increased to a desired value by varying the total number of grooves and their groove length and groove depth.

As illustrated in FIG. 4B, each groove 140 also has a trapezoidal shape, with two sides 142, 144 and a floor 146. The shape of the groove may vary depending on the etching method, and for example may be rectangular, or triangular (i.e. without a floor), or trapezoidal. An illustrative example of a fin 120 with rectangular grooves 140 is provided in FIG. 4D, and an illustrative example of a fin 120 with triangular grooves 140 is provided in FIG. 4E.

Figure 5C:
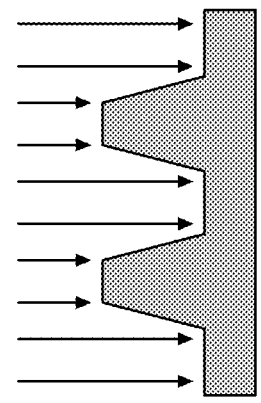
FIG. 5C is a lateral side cross-sectional view along line C-C of FIG. 5A.
Figure 5A:
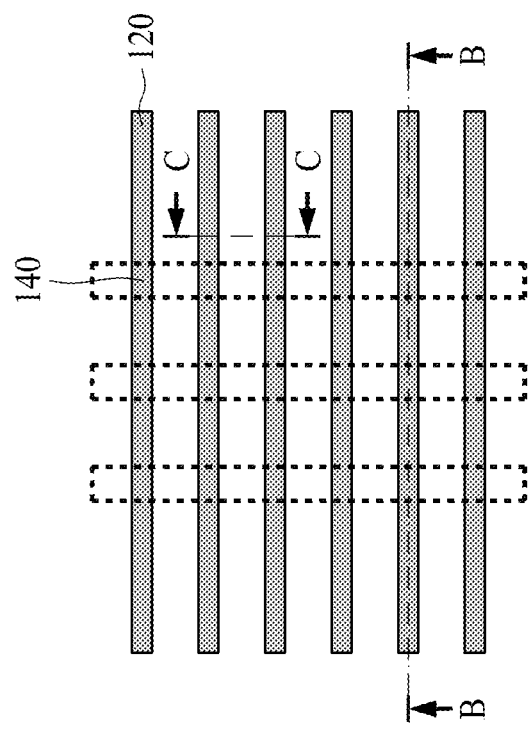
FIG. 5A is a plan view of the set of grooved fins, showing optional ion implantation.
Figure 5B:
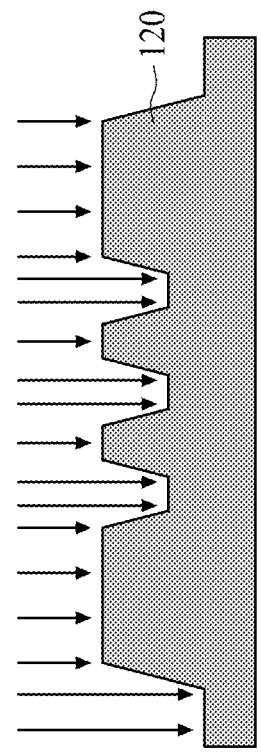
FIG. 5B is a longitudinal side cross-sectional view along line B-B of FIG. 5A.

Referring now to FIGS. 5A-5C, in an optional step, ion implantation is performed on the fin 120 (indicated with arrows). This may be done, for example, to set the threshold voltage to a desired value, or to modify other behavior or properties. Common p-type dopants may include boron or gallium. Common n-type dopants may include phosphorus or arsenic. The ion implantation is also illustrated in FIG. 5C as being performed in the areas between fins, but this is not required, and ion implantation can be performed solely on the fins using appropriate masking of the areas between fins.

Figure 6C:
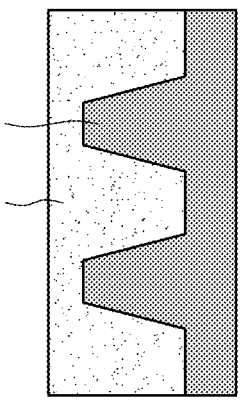
FIG. 6C is a lateral side cross-sectional view along line C-C of FIG. 6A.
Figure 6A:
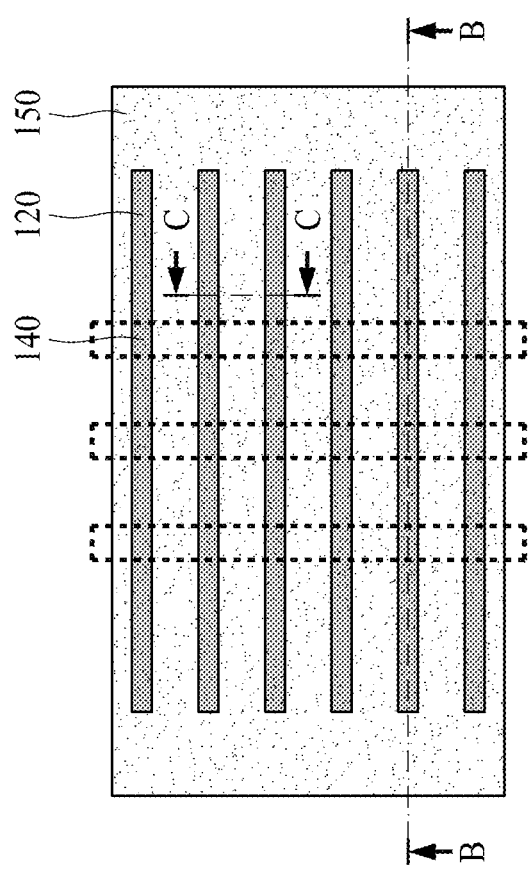
FIG. 6A is a plan view of the set of grooved fins, showing application of an STI layer.
Figure 6B:
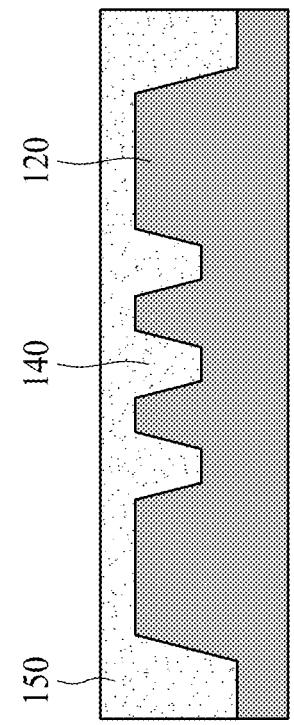
FIG. 6B is a longitudinal side cross-sectional view along line B-B of FIG. 6A.

Continuing in FIGS. 6A-6C, a shallow trench isolation (STI) layer 150 is deposited over the fins 120. The STI layer is formed from a dielectric material, commonly silicon dioxide, although other dielectric materials can also be used such as undoped polysilicon, silicon oxide, silicon nitride, silicon oxynitride, fluoride-doped silicate glass, or other low-k dielectric material. The deposition can be done using physical vapor deposition (PVD) or chemical vapor deposition (CVD) or spin-on processes known in the art, or can be grown via oxidation. As seen in FIG. 5B, the STI layer also fills the grooves 140.

Figure 7C:
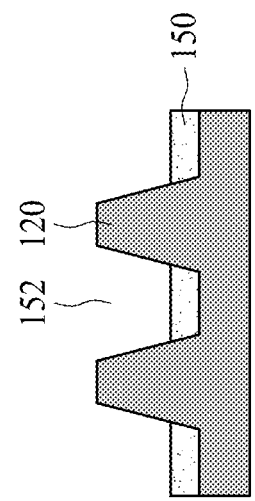
FIG. 7C is a lateral side cross-sectional view along line C-C of FIG. 7A.
Figure 7A:
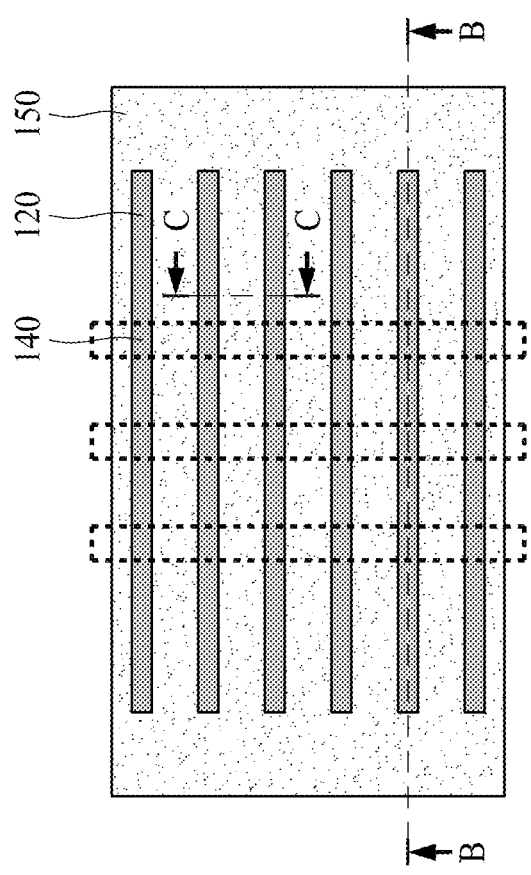
FIG. 7A is a plan view of the set of grooved fins, after etching of the STI layer.
Figure 7B:
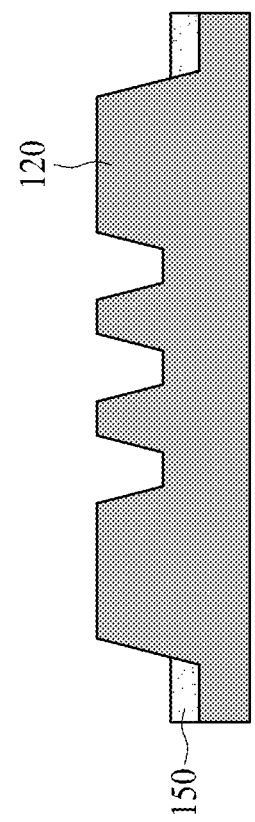
FIG. 7B is a longitudinal side cross-sectional view along line B-B of FIG. 7A.

Continuing with FIGS. 7A-7C, the STI layer 150 is etched. This can be done, for example, using wet etching processes, dry etching processes, or plasma etching. As illustrated here, the STI layer is etched to a level below the grooves 140, such that the STI layer is not present within the grooves, and fills only the areas between fins to form isolation regions 152 between adjacent fins. As will be seen further herein, in other embodiments, the STI layer can be present within the grooves.

Figure 8C:
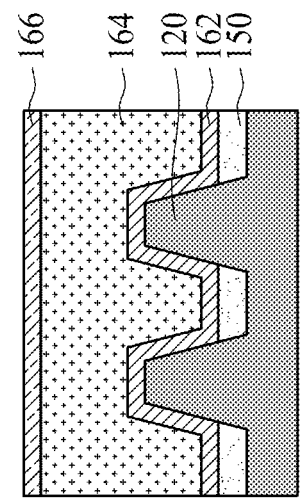
FIG. 8C is a lateral side cross-sectional view along line C-C of FIG. 8A.
Figure 8A:
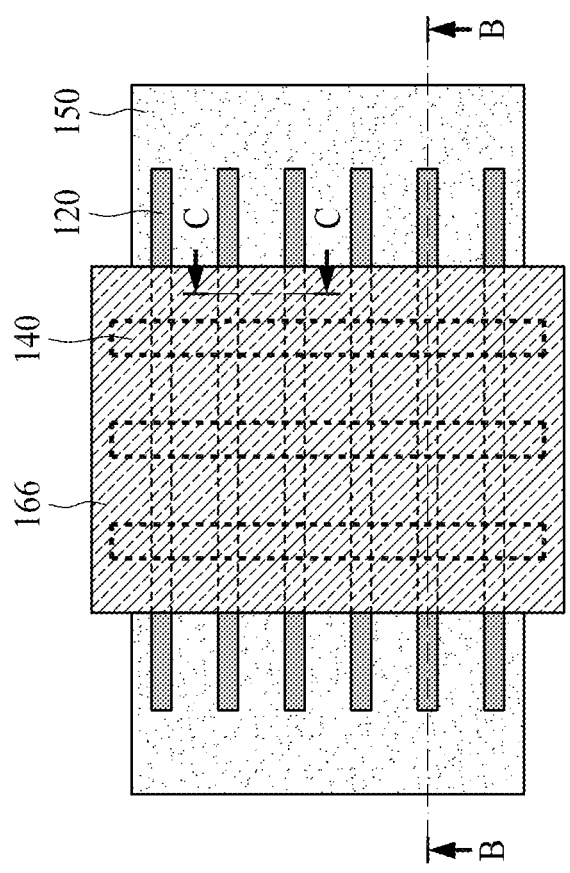
FIG. 8A is a plan view of the set of grooved fins, showing the formation of a gate stack across the grooves in the fins.
Figure 8B:
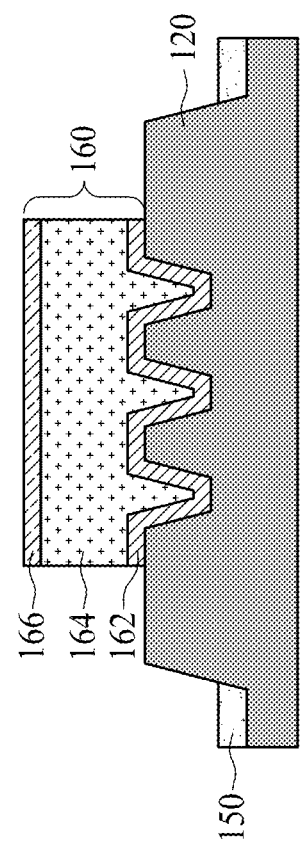
FIG. 8B is a longitudinal side cross-sectional view along line B-B of FIG. 8A.

Next, in FIGS. 8A-8C, a first gate stack 160 is formed. As seen in FIG. 8B, the gate stack 160 fills the grooves 140. As seen in FIG. 8C, the gate stack 160 also fills the areas between adjacent fins 120. As illustrated here, the gate stack 160 includes a gate oxide layer 162 adjacent the fin 120, and a gate layer 164 upon the gate oxide layer 162. An optional cap layer 166 upon the gate layer 164 is also illustrated.

The gate oxide layer may be any dielectric material, for example silicon dioxide, hafnium silicate, zirconium silicate, hafnium dioxide, or zirconium dioxide. The gate oxide layer 162 may be very thin compared to the gate layer 164. The gate oxide layer may be formed by a process that produces a thin film, such as atomic layer deposition (ALD). Alternatively, the gate oxide layer can be grown by thermal oxidation of the substrate, for example at a temperature of about 850° C. to about 950° C. in the presence of water or oxygen ($O_2$). As yet another example, the gate oxide layer could be formed by a chemical vapor deposition (CVD) process, for example using 02 along with silane ($SiH_4$) or dichlorosilane ($SiH_2Cl_2$), or using tetraethyl orthosilicate (TEOS) at elevated temperatures above about 600° C. As yet another example, the gate oxide layer could be formed by the decomposition of TEOS at temperatures of about 600° C. to about 650° C., or through plasma enhanced CVD at lower temperatures.

The gate layer may be any electrically conductive material, for example aluminum, polysilicon (doped or undoped), tungsten, a metal silicide such as TiSi or $MoSi_2$ or TaSi or $WSi_2$, or material such as Ta, TaN, Nb, WN, or $WN/RuO_2$. The cap layer 166, when present, is used as a mask and can be made of appropriate materials such as silicon oxide, silicon nitride, silicon oxynitride, or other metal. The gate layer 164 and the optional cap layer 166 may be formed by PVD or CVD, or by other processes such as sputtering.

As will be seen further below, this gate stack may be a dummy gate stack which is subsequently removed and replaced, or may be used as the gate terminal in the final semiconductor device. The three layers may each be individually deposited upon the substrate, then a patterned mask is applied (e.g. photoresist) and the layers are etched to obtain the gate stack in the desired location. Wet etching processes, dry etching processes, or plasma etching may be used as desired for etching of each layer.

Figure 9C:
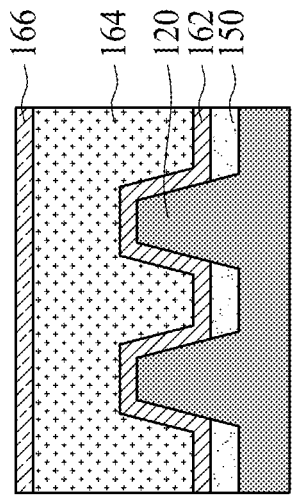
FIG. 9C is a lateral side cross-sectional view along line C-C of FIG. 9A.
Figure 9A:
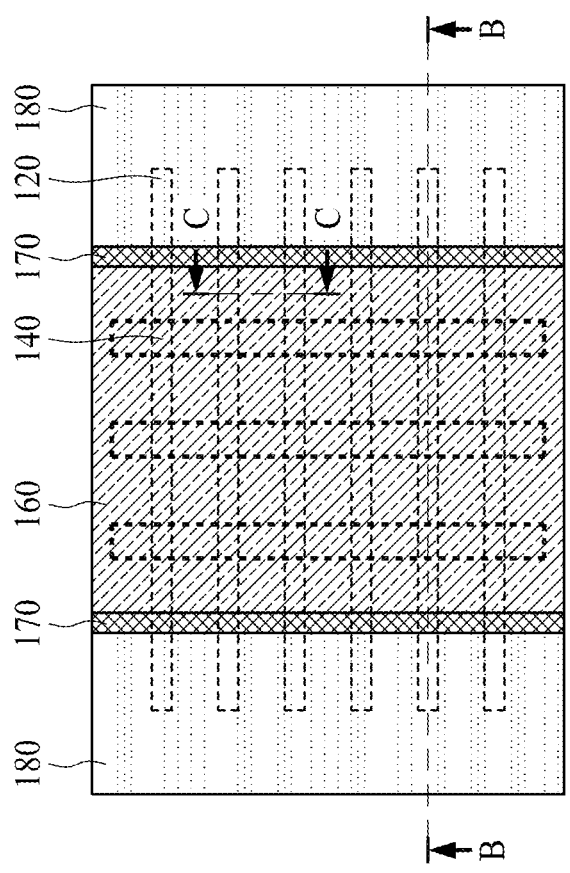
FIG. 9A is a plan view of the set of grooved fins, showing the formation of gate spacers and a dielectric layer around the gate stack.
Figure 9B:
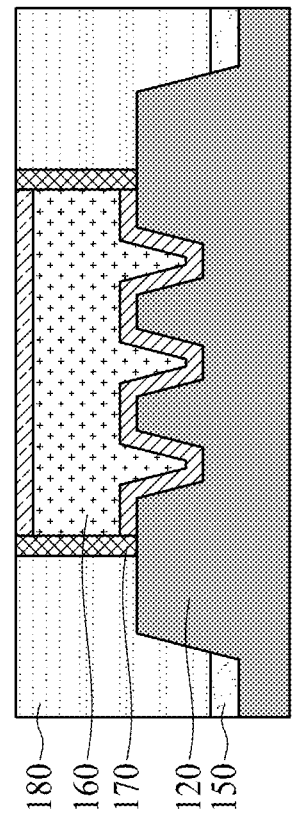
FIG. 9B is a longitudinal side cross-sectional view along line B-B of FIG. 9A.

In FIGS. 9A-9C, gate spacers 170 and a dielectric layer 180 are formed upon the exposed portions of the fins 120 and the STI layer 150. The fins 120 are shown in dashed line outline. The gate spacers act as an electrical insulator, and can be made from any oxide, such as silicon dioxide (which may be doped with fluorine or carbon). The gate spacer can be formed by a deposition process (e.g. PVD or CVD) on the entire surface, then applying a patterned mask and etching to remove material from undesired locations. The dielectric layer 180 may be any suitable material, such as silicon dioxide (which may be doped with fluorine or carbon).

Figure 10C:
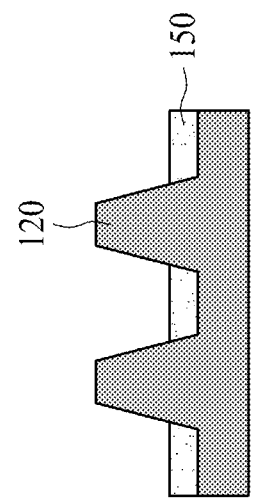
FIG. 10C is a lateral side cross-sectional view along line C-C of FIG. 10A.
Figure 10A:
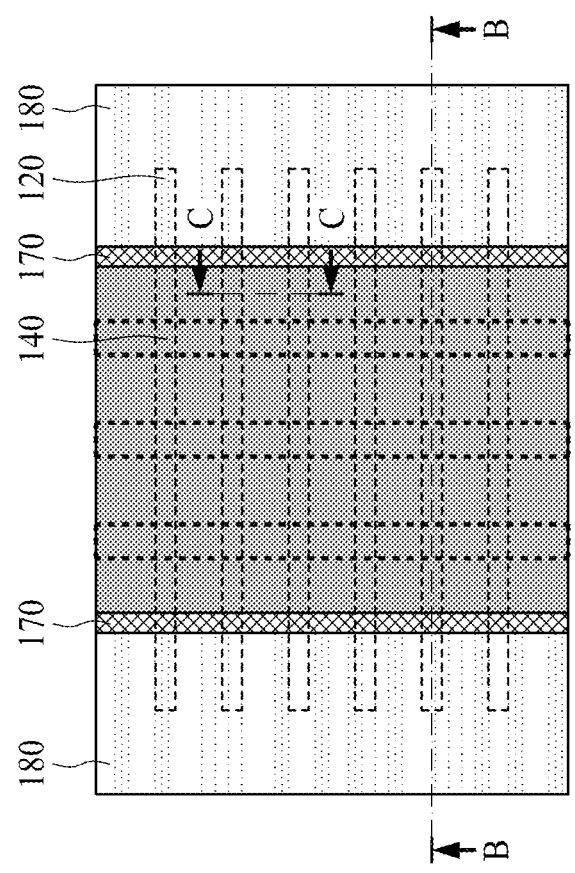
FIG. 10A is a plan view of the set of grooved fins, where the gate stack is a dummy gate stack and is subsequently removed, in accordance with some embodiments.
Figure 10B:
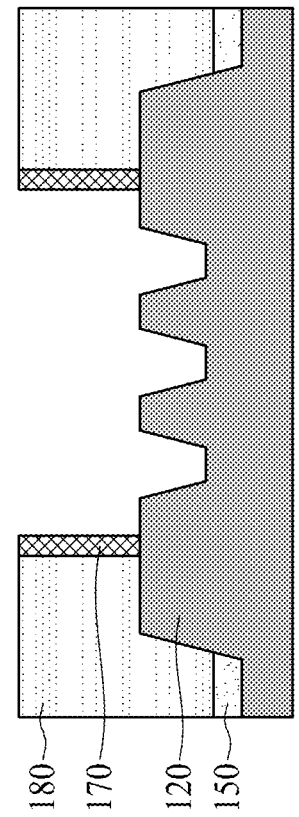
FIG. 10B is a longitudinal side cross-sectional view along line B-B of FIG. 10A.

In some embodiments, the gate stack 160 acts as a dummy stack that provides support for forming the gate spacers 170. In FIGS. 10A-10C, the gate stack 160 is removed. For example, a patterned mask can be placed over the gate spacers 170 and the dielectric layer 180, leaving the gate stack exposed, and the gate stack is then removed using an appropriate etching process.

Figure 11C:
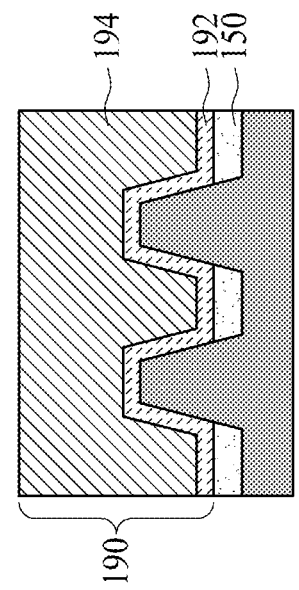
FIG. 11C is a lateral side cross-sectional view along line C-C of FIG. 11A.
Figure 11A:
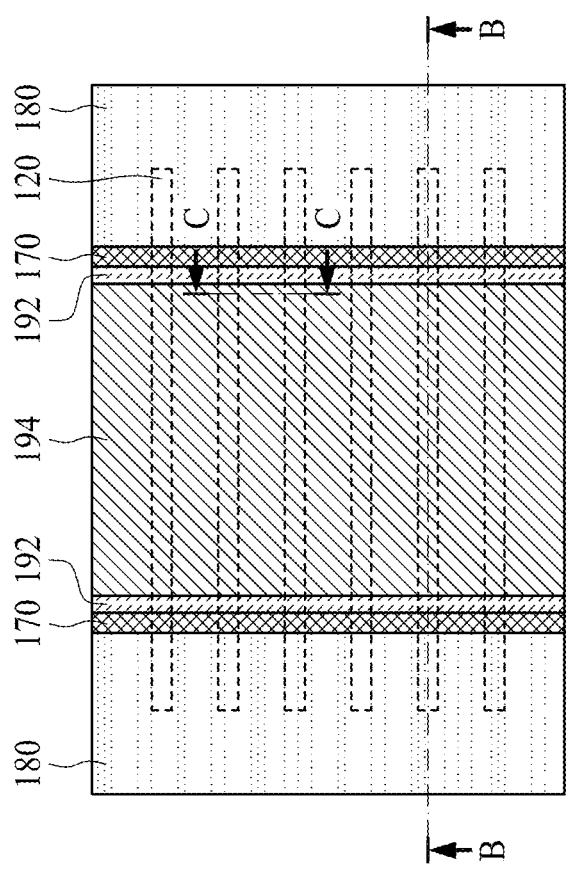
FIG. 11A is a plan view of the set of grooved fins, showing the formation of a new gate stack including a gate oxide layer and a gate layer, in accordance with some embodiments.
Figure 11B:
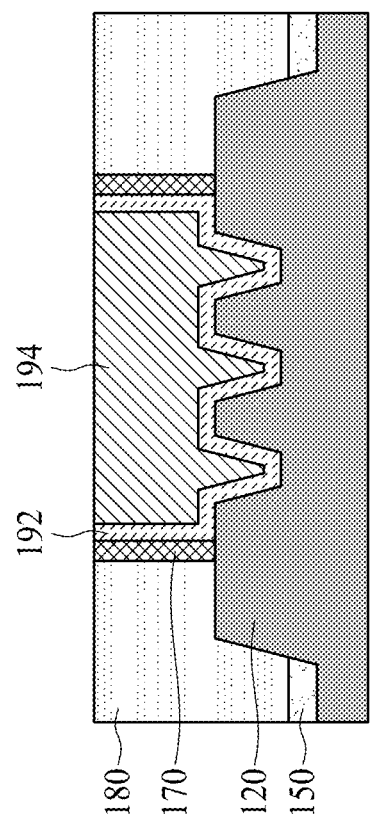
FIG. 11B is a longitudinal side cross-sectional view along line B-B of FIG. 11A.

In FIGS. 11A-11C, a new gate stack 190 is then formed. As illustrated here, the new gate stack includes a gate oxide layer 192 and a gate layer 194. Compared to the gate oxide layer 162 of FIGS. 8A-8C, the gate oxide layer also runs up the side of the gate spacers 170, and can be formed using ALD. Again, the gate oxide layer may be any dielectric material, for example silicon dioxide, hafnium silicate, zirconium silicate, hafnium dioxide, or zirconium dioxide. The gate layer 194 can be, for example, a single-layer structure formed from a single metal, or can be a multi-layer structure containing different metals. The gate layer can be deposited using methods such as PVD or CVD or sputtering. Again, the steps shown in FIGS. 10A-11C are optional, and the original gate stack formed in FIGS. 8A-8C can be maintained in the final device if desired.

Figure 12A:
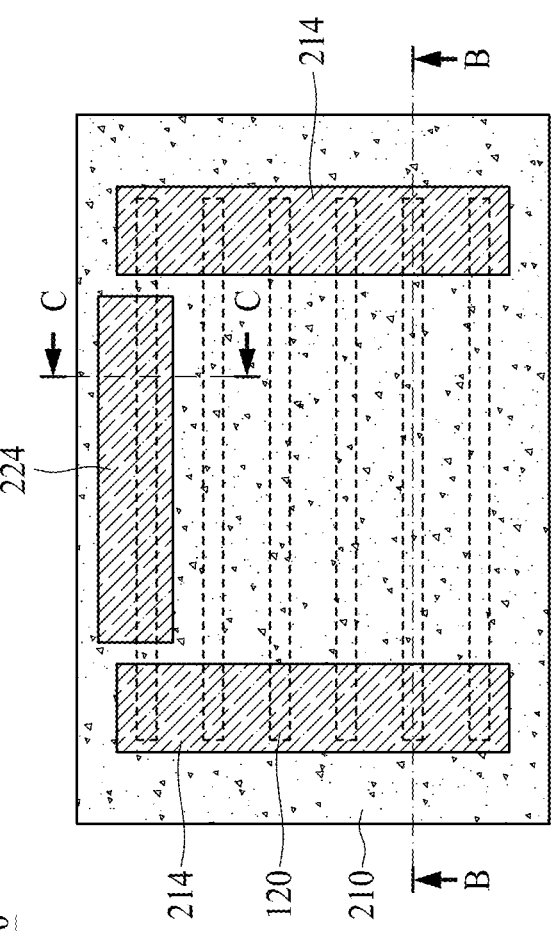
FIG. 12A is a plan view of the completed transistor, including vias and contacts for the source terminal, drain terminal, and the gate terminal, in accordance with some embodiments.
Figure 12B:
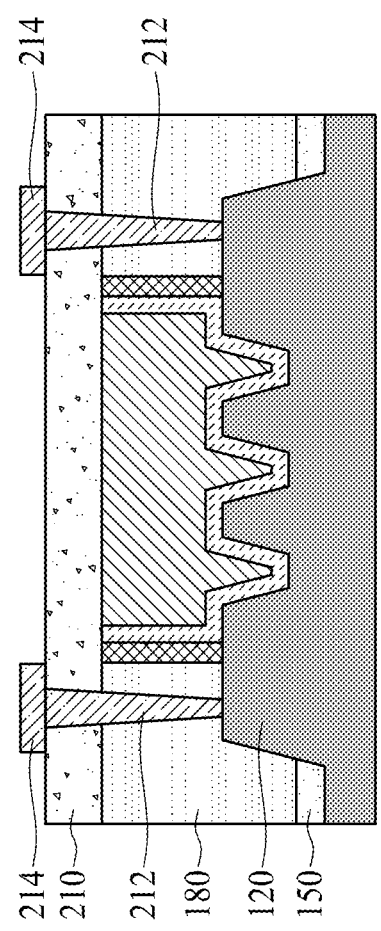
FIG. 12B is a longitudinal side cross-sectional view along line B-B of FIG. 12A.
Figure 12C:
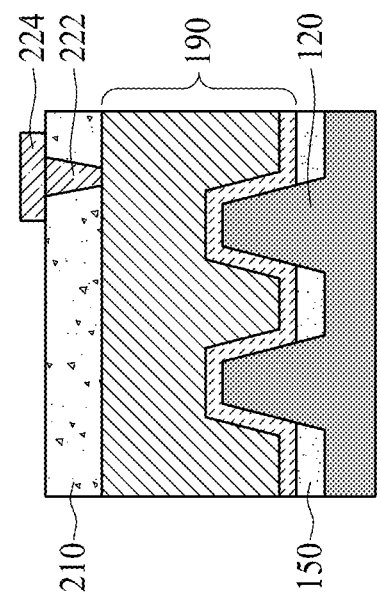
FIG. 12C is a lateral side cross-sectional view along line C-C of FIG. 12A.
Figure 13:
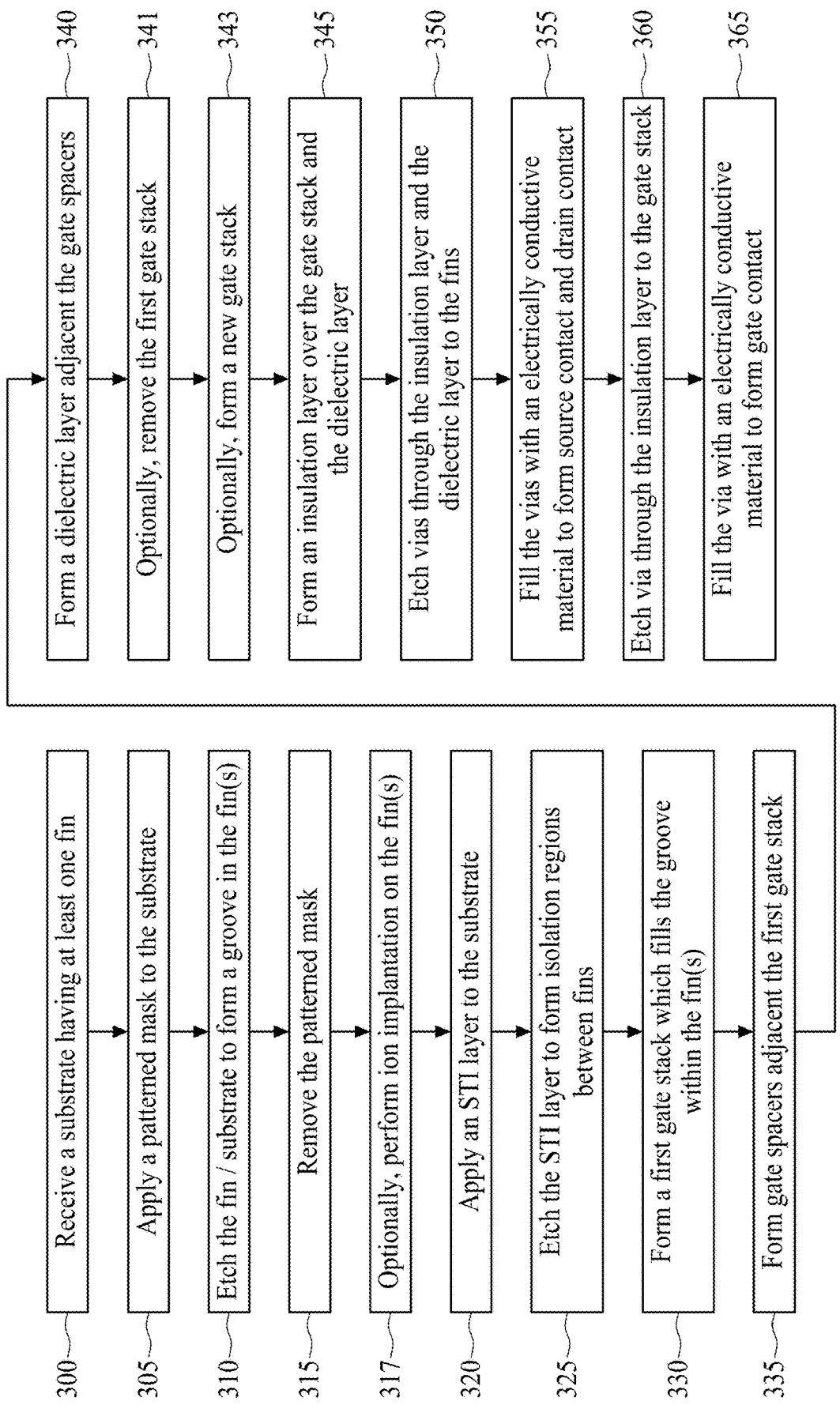
FIG. 13 is a flowchart showing the steps in a first method for forming a semiconductor device, in accordance with some embodiments herein.

Finally, in FIGS. 12A-12C, additional layers are formed to complete the semiconductor device/transistor 200. An insulation layer 210 is deposited over the gate stack 190 and the dielectric layer 180. As best seen in FIG. 12B, vias 212 are etched through the insulation layer 210 and the dielectric layer 180 down to the fins 120, and then filled with an electrically conductive material which is also used to form contacts 214 for the source terminal and the drain terminal. As best seen in FIG. 12C, a via 222 is also etched through the insulation layer 210 down to the gate stack 190, then filled with an electrically conductive material which is also used to form a contact 224 for the gate terminal. The insulation layer is electrically insulating, and can be made from any appropriate material.

FIG. 13 is a flowchart summarizing the various steps illustrated in FIGS. 2A-12C.

In step 300, a substrate with at least one fin is received. The substrate usually has a plurality of fins thereon. This is illustrated in FIGS. 2A-2C.

In step 305, a mask with a pattern is applied to the substrate. The pattern extends across the width of the fin(s), and exposes one or more portions of the fin. This is illustrated in FIGS. 3A-3C.

In step 310, the fin/substrate is etched. This forms a groove in the fin which extends across the entire width of the fin. Multiple grooves can be formed in this step if desired. In step 315, the mask is removed. The result after this step is illustrated in FIGS. 4A-4C.

In optional step 317, ion implantation is performed on the fin(s). This is illustrated in FIGS. 5A-5C.

In step 320, an STI layer is applied to the substrate. The STI layer may cover the fins. This is illustrated in FIGS. 6A-6C. In step 325, the STI layer is etched to form isolation regions between fins. This is illustrated in FIGS. 7A-7C.

In step 330, a first gate stack is formed which fills the groove(s) within the fin(s). The layers within the gate stack include a gate oxide layer, a gate layer, and an optional cap layer. This is illustrated in FIGS. 8A-8C.

In step 335, gate spacers are formed adjacent the first gate stack. In step 340, a dielectric layer is formed adjacent the gate spacers, such that the gate spacers separate the dielectric layer from the first gate stack. This is illustrated in FIGS. 9A-9C.

In optional step 341, the first gate stack is removed. This is illustrated in FIGS. 10A-10C. In optional step 343, a second or new gate stack is formed. The second gate stack may comprise a gate oxide layer and a metal gate layer. This is illustrated in FIGS. 11A-11C. It is noted that these steps are optional, and the first gate stack may be maintained within the final semiconductor device if desired.

In step 345, an insulation layer is formed over the gate stack and the dielectric layer. In step 350, vias are etched through the insulation layer and the dielectric layer, exposing portions of the fin(s). In step 355, the vias are filled with an electrically conductive material. In step 360, a via is etched through the insulation layer, exposing a portion of the gate stack. In step 365, the via is filled with an electrically conductive material. These vias form contacts for the source terminal, the drain terminal, and the gate terminal. It is noted that steps 350, 355, 360, 365 can be performed in any desired order. The result is illustrated in FIGS. 12A-12C.

FIGS. 14A-16C illustrate a second method for forming such a semiconductor device, in accordance with some embodiments. In this second embodiment, the grooves within the fins are formed at the same time as the fins. Put another way, the same photolithographic and etching steps are also used to form the grooves.

Figure 14A:
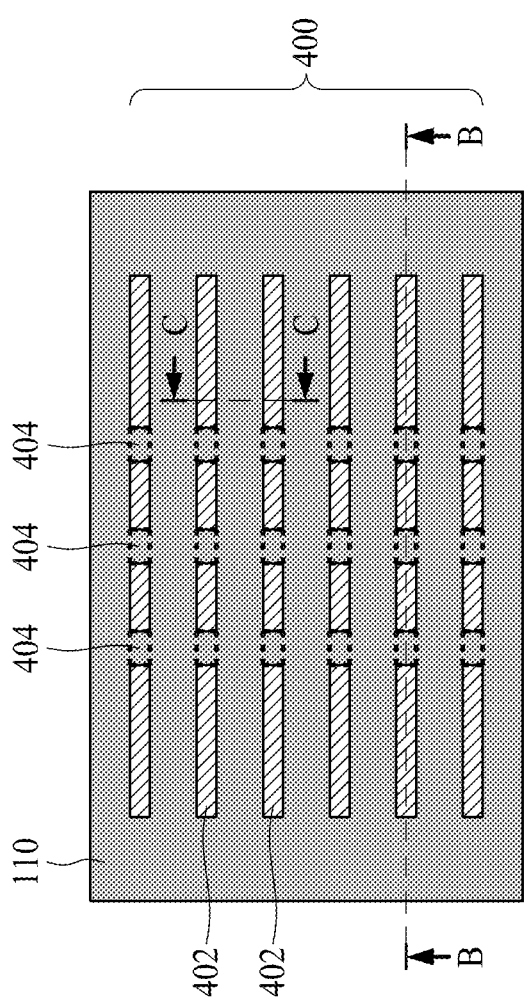
FIG. 14A is a plan view showing a substrate with a mask applied thereon to form a set of grooved fins.
Figure 14C:
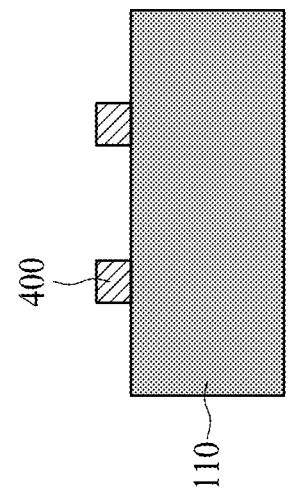
FIG. 14C is a lateral side cross-sectional view along line C-C of FIG. 14A.
Figure 14B:
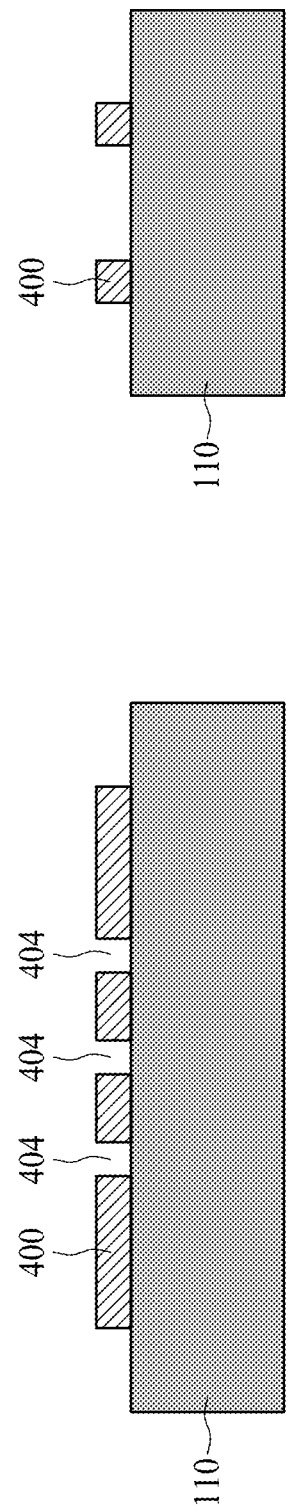
FIG. 14B is a longitudinal side cross-sectional view along line B-B of FIG. 14A.

Initially, FIGS. 14A-14C illustrate the substrate 110 with a patterned mask 400 thereon. The substrate 110 is exposed in all areas except where the fins are desired to be placed or located. The entire substrate, including the areas between where the fins will be etched, are shown in all three views. The patterned mask 400 includes one or more spacer lines 402; multiple spacer lines are shown here. Each spacer line 402 includes at least one gap 404 (indicated as a dotted box); three gaps are illustrated in each spacer line in this example. The length of each gap Lg is less than or equal to a width of the spacer line Sw. The spacer lines correspond to the areas on the substrate that will become fins. The spacer line gaps 404 correspond to the groove(s) that will be formed in the fins.

Figure 15C:
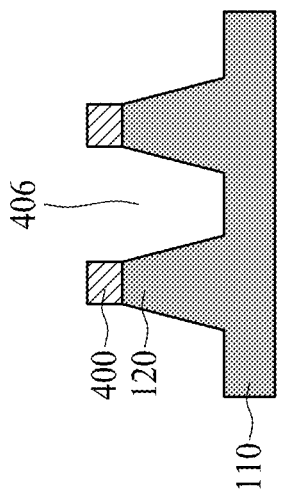
FIG. 15C is a lateral side cross-sectional view along line C-C of FIG. 15A.
Figure 15A:
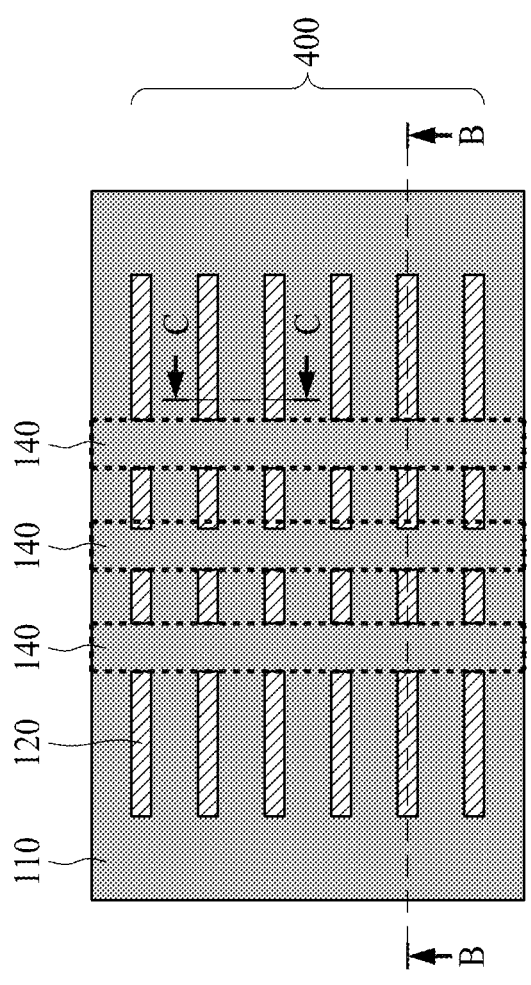
FIG. 15A is a plan view showing the substrate after etching to form the grooves and the fins concurrently.
Figure 15B:
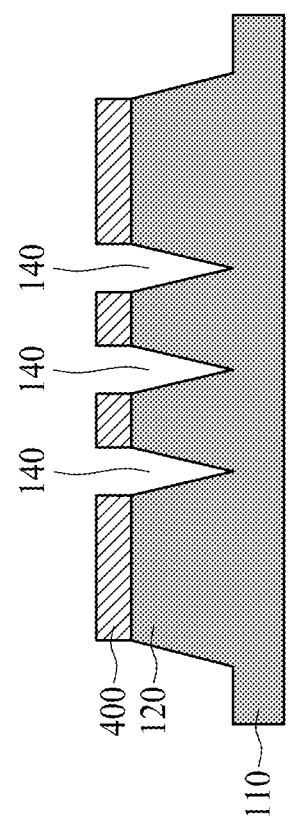
FIG. 15B is a longitudinal side cross-sectional view along line B-B of FIG. 15A.

FIGS. 15A-15C illustrate the substrate 110 after etching, with the patterned mask 400 still applied thereon. The plan view of FIG. 15A has dotted rectangles indicating where the grooves 140 have been formed. The grooves are more visible in FIG. 15B. The fins 120 are now visible in FIG. 15C, along with the areas 406 between fins.

In FIGS. 16A-16C, the patterned mask has been removed. In the plan view of FIG. 16A, the substrate is no longer shown between the fins 120 for clarity. Dotted rectangles are used again to indicate the location of the grooves 140 on the fins 120. In this second embodiment, the groove depth Dg is substantially equal to the initial fin depth DO. The resulting structure is substantially similar to the structure depicted in FIGS. 4A-4C.

Continuing then, FIGS. 17A-20C illustrate some alternative processing steps which can also be used to prepare a semiconductor device.

Figure 17C:
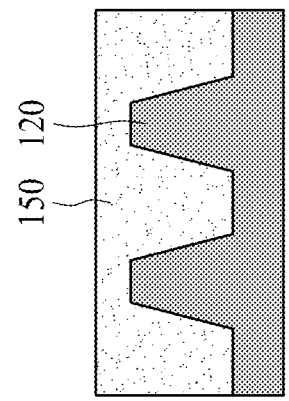
FIG. 17C is a lateral side cross-sectional view along line C-C of FIG. 17A.
Figure 17A:
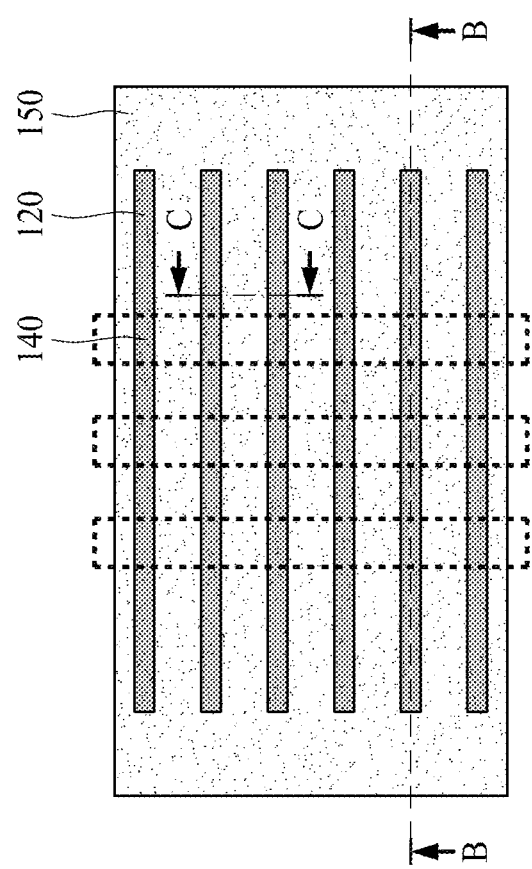
FIG. 17A is a plan view of the set of grooved fins, showing application of an STI layer.
Figure 17B:
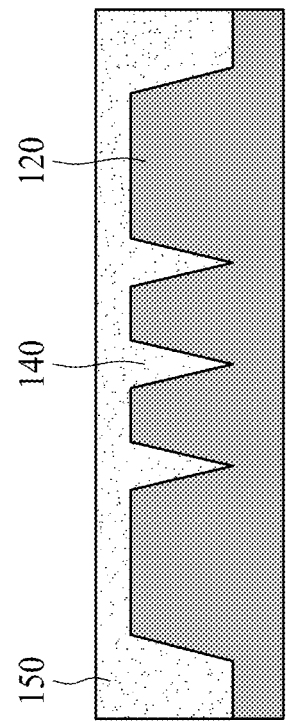
FIG. 17B is a longitudinal side cross-sectional view along line B-B of FIG. 17A.

In FIGS. 17A-17C, a shallow trench isolation (STI) layer 150 is deposited over the fins 120. As seen in FIG. 17B, the STI layer also fills the grooves 140. The resulting structure is substantially similar to the structure depicted in FIGS. 6A-6C.

Figure 18C:
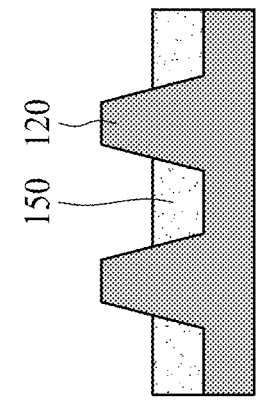
FIG. 18C is a lateral side cross-sectional view along line C-C of FIG. 18A.
Figure 18A:
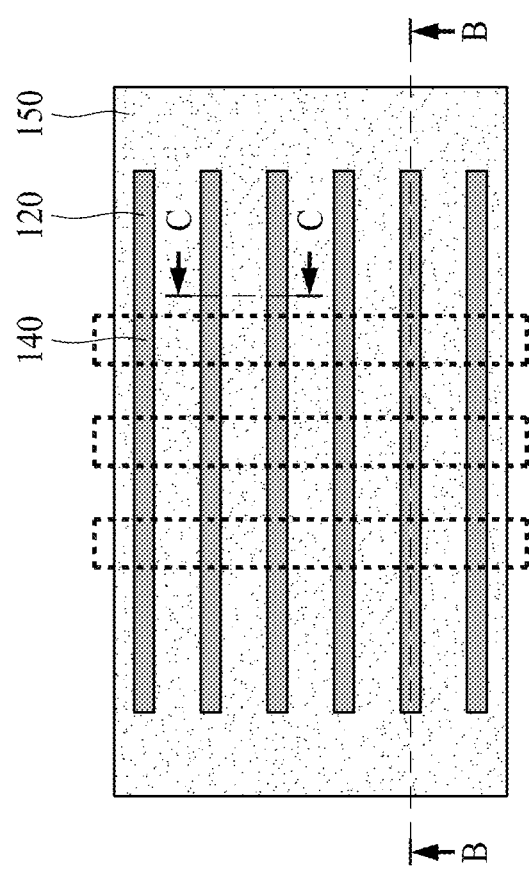
FIG. 18A is a plan view of the set of grooved fins, after etching of the STI layer.
Figure 18B:
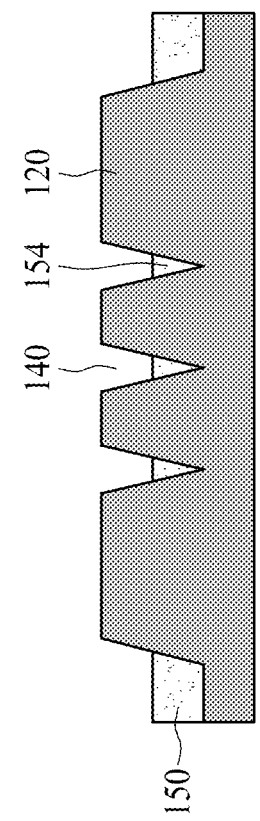
FIG. 18B is a longitudinal side cross-sectional view along line B-B of FIG. 18A.

In FIGS. 18A-18C, the STI layer is then etched. However, in contrast to the structure of FIGS. 7A-7C, the STI layer is etched such that the STI layer is still present within the grooves (indicated with reference numeral 154).

Figure 19C:
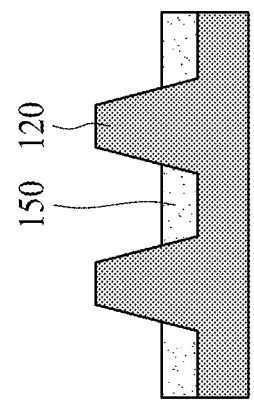
FIG. 19C is a lateral side cross-sectional view along line C-C of FIG. 19A.
Figure 19A:
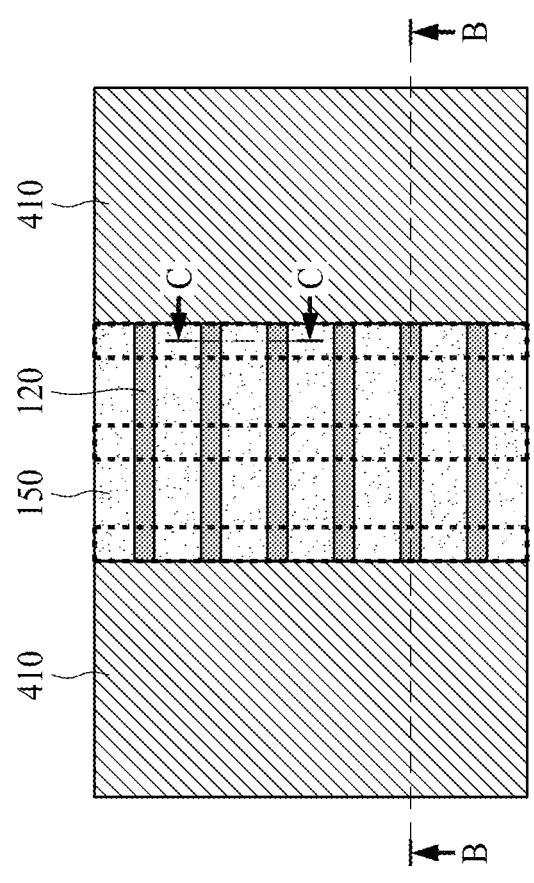
FIG. 19A is a plan view of the set of grooved fins, with a mask applied to the ends of the fins and the portions of the STI layer within the exposed grooves further etched to reduce their depth, in accordance with some embodiments.
Figure 19B:
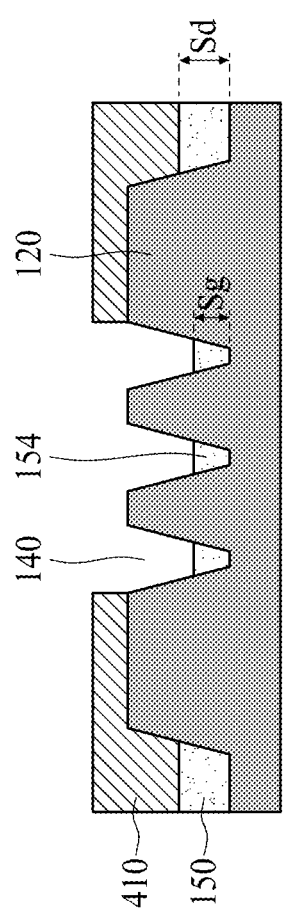
FIG. 19B is a longitudinal side cross-sectional view along line B-B of FIG. 19A.

Next, as illustrated in FIGS. 19A-19C, a patterned mask 410 (e.g. photoresist) can be applied to the ends of the fin(s) 120, leaving the grooves 140 exposed. Further etching is then performed, such that the depth of the STI portions 154 within the grooves Sg and in the area where the gate stack will be formed is less than the depth of the STI portions in the area where the dielectric layer will be formed Sd.

Figure 20C:
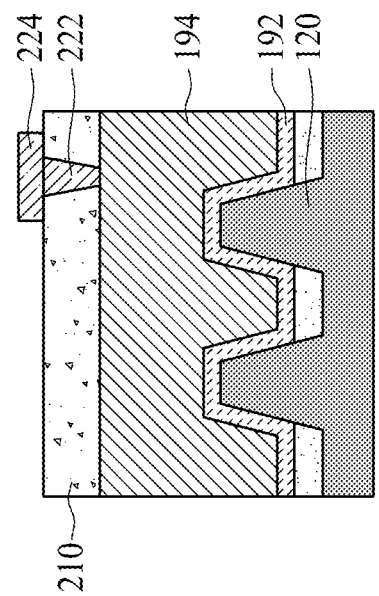
FIG. 20C is a lateral side cross-sectional view along line C-C of FIG. 20A.
Figure 20A:
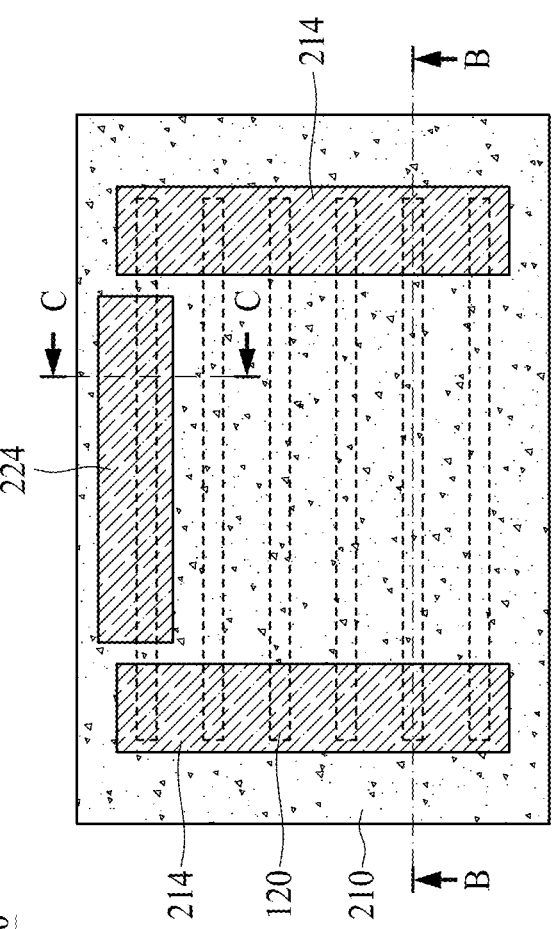
FIG. 20A is a plan view of the completed transistor, including vias and contacts for the source terminal, drain terminal, and the gate terminal, in accordance with some embodiments. The depth of the portions of the STI layer within the exposed grooves can also be used to control the capacitance by changing the overlapping surface area between the gate and the fins.
Figure 20B:
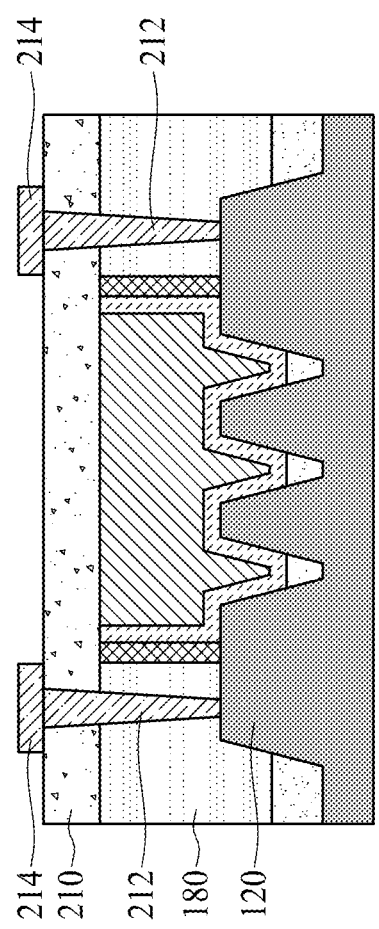
FIG. 20B is a longitudinal side cross-sectional view along line B-B of FIG. 20A.

FIGS. 20A-20C illustrate the resulting transistor 200 after the gate oxide layer 192, gate layer 194, gate spacers 170, dielectric layer 180, insulation layer 210, vias 212, 222, and contacts 214, 216, 224 are applied as described in FIGS. 8A-12C and in the flowchart of FIG. 13. The presence of the STI layer between the fins and the gate oxide layer provides another way to control the capacitance, by changing the overlapping surface area between the gate stack and the fins.

FIG. 21 is a flowchart summarizing the various steps illustrated in FIGS. 14A-20C.

In step 505, a mask with a pattern is applied to the substrate. The pattern includes one or more spacer lines, corresponding to the number of fins to be formed. Each spacer line has one or more gaps which will correspond to the grooves. The length of each gap is less than or equal to the width of the spacer line This is illustrated in FIGS. 14A-14C.

In step 510, the substrate is etched. This forms one or more fins, which have one or more grooves that extend across the width of the fin. This is illustrated in FIGS. 15A-15C.

In step 515, the mask is removed. The result after this step is illustrated in FIGS. 16A-16C.

In optional step 517, ion implantation is performed on the fin(s). This step corresponds to that previously illustrated in FIGS. 5A-5C, and is not illustrated again.

In step 520, an STI layer is applied to the substrate. The STI layer may cover the fins. This is illustrated in FIGS. 17A-17C. In step 525, the STI layer is etched to form isolation regions between fins. Portions of the STI layer are still present within the grooves. This is illustrated in FIGS. 18A-18C.

Next, in step 530, a mask is applied to the ends of the fin(s), leaving the grooves exposed. In step 535, the grooves are further etched so that the depth of the STI portions within the grooves is reduced compared to the depth of the STI portions in the area beyond the ends of the fins. The result after this step is illustrated in FIGS. 19A-19C.

Next, in step 540, a first gate stack is formed which fills the groove(s) within the fin(s). The layers within the gate stack include a gate oxide layer, a gate layer, and an optional cap layer. In step 545, gate spacers are formed adjacent the first gate stack. In step 550, a dielectric layer is formed adjacent the gate spacers, such that the gate spacers separate the dielectric layer from the first gate stack. These steps correspond to those previously illustrated in FIGS. 8A-9C, and are not illustrated again.

In optional step 551, the first gate stack is removed. In optional step 553, a second or new gate stack is formed. The second gate stack may comprise a gate oxide layer and a metal gate layer. Again, these steps are optional, and the first gate stack may be maintained within the final semiconductor device if desired. These steps correspond to those previously illustrated in FIGS. 10A-11C, and are not illustrated again.

In step 555, an insulation layer is formed over the gate stack and the dielectric layer. In step 560, vias are etched through the insulation layer and the dielectric layer, exposing portions of the fin(s). In step 565, the vias are filled with an electrically conductive material. In step 570, a via is etched through the insulation layer, exposing a portion of the gate stack. In step 575, the via is filled with an electrically conductive material. These vias form contacts for the source terminal, the drain terminal, and the gate terminal. The steps for forming the contacts 560, 565, 570, 575 can be performed in any order. The result is illustrated in FIGS. 20A-20C.

FIGS. 22A-28E illustrate a third method and a fourth method for forming a semiconductor device, in accordance with some embodiments. In these two methods, the semiconductor device includes two separate transistors, which have different capacitances. The transistor with a higher capacitance is denoted as a "capacitor region", and the transistor with a lower capacitance is denoted as a "normal region". Again, for clarity, the plan views do not include the areas between fins. FIG. 29 is a flowchart summarizing the various steps in these two methods, and will be further discussed after FIGS. 21A-28E.

Figure 22A:
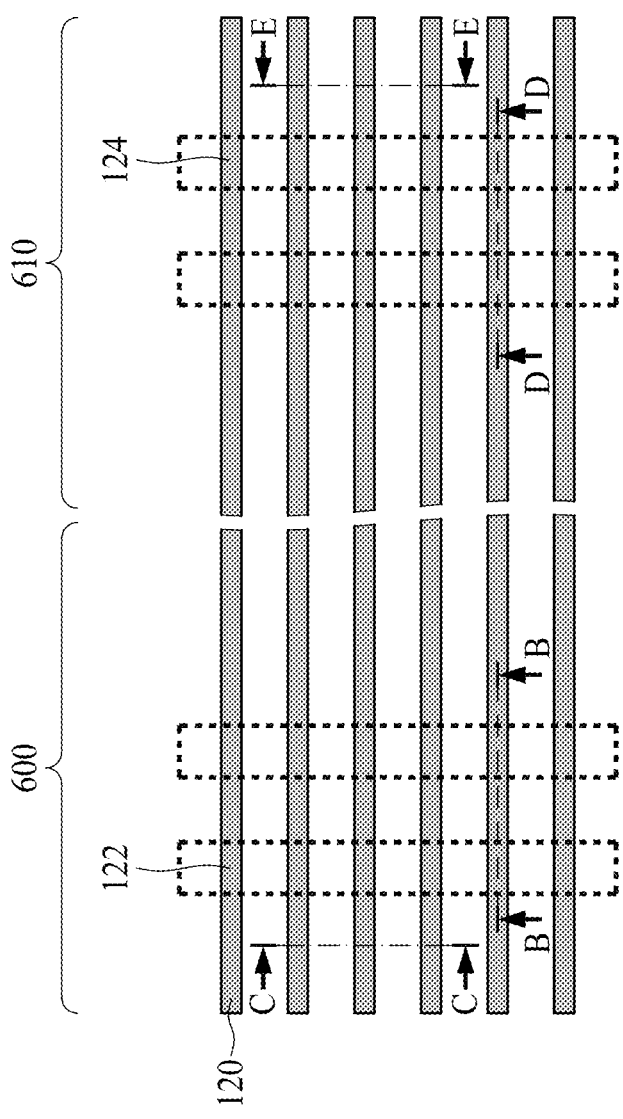
FIG. 22A is a plan view of a set of grooved fins, divided into a capacitor region (left-hand side) and a normal region (right-hand side).
Figure 22B:
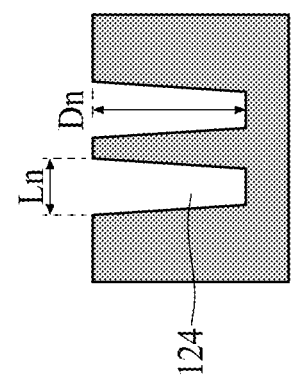
FIG. 22B is a longitudinal side cross-sectional view of the capacitor region along line B-B of FIG. 22A.
Figure 22C:
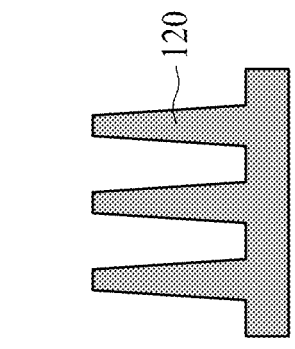
FIG. 22C is a lateral side cross-sectional view of the capacitor region along line C-C of FIG. 22A.
Figure 22D:
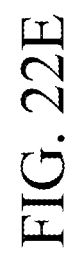
FIG. 22D is a longitudinal side cross-sectional view of the normal region along line D-D of FIG. 22A.
Figure 22E:
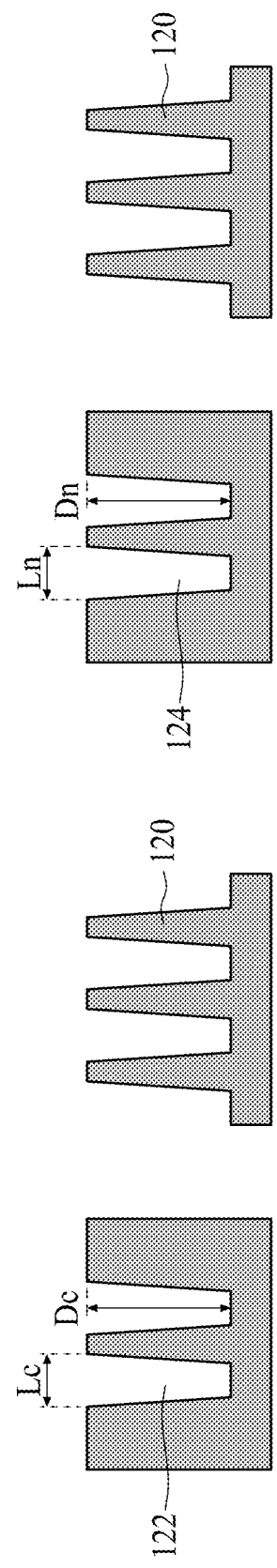
FIG. 22E is a lateral side cross-sectional view of the normal region along line E-E of FIG. 22A.
Figure 23A:
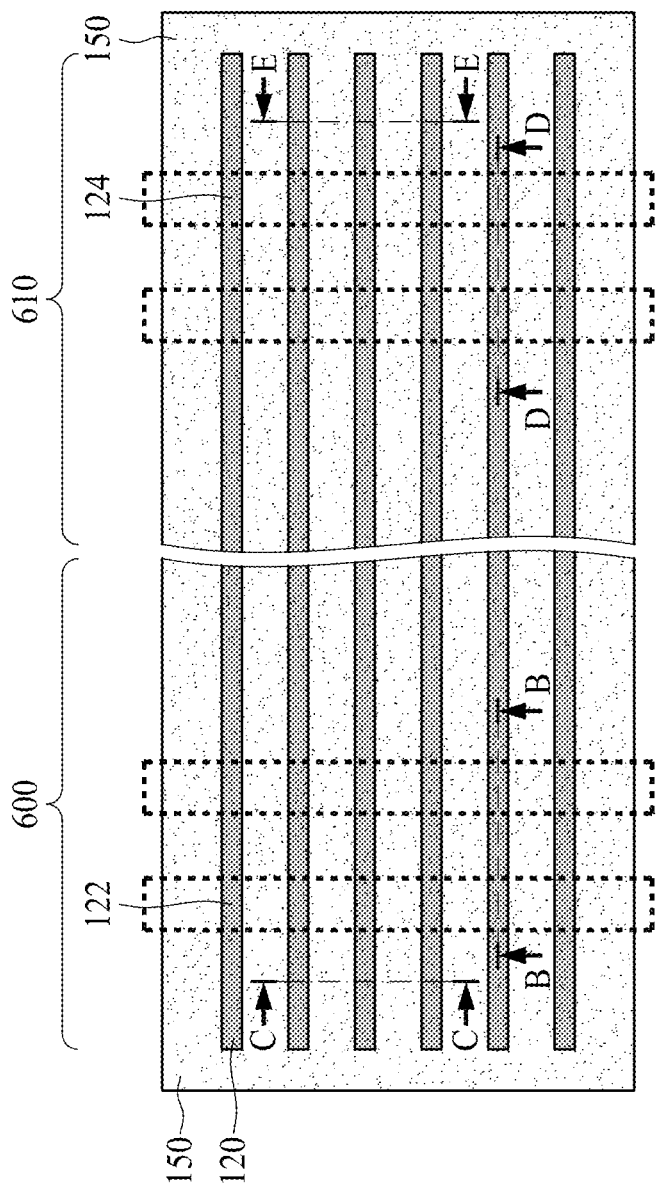
FIG. 23A is a plan view of the set of grooved fins, showing application of an STI layer.
Figure 23E:
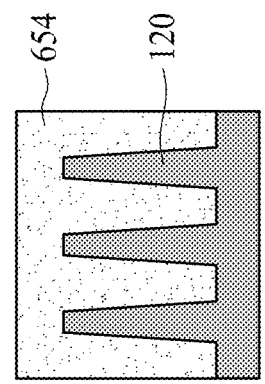
FIG. 23E is a lateral side cross-sectional view of the normal region along line E-E of FIG. 23A.
Figure 23D:
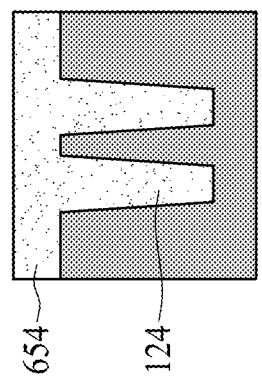
FIG. 23D is a longitudinal side cross-sectional view of the normal region along line D-D of FIG. 23A.
Figure 23C:
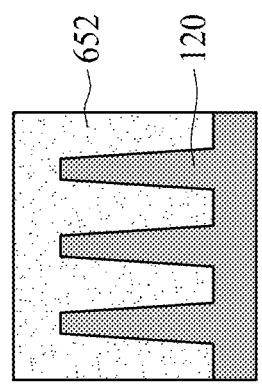
FIG. 23C is a lateral side cross-sectional view of the capacitor region along line C-C of FIG. 23A.
Figure 23B:
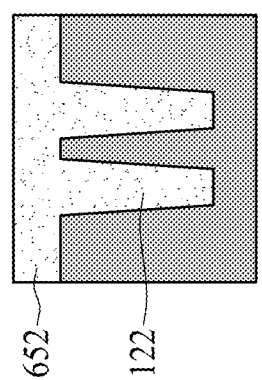
FIG. 23B is a longitudinal side cross-sectional view of the capacitor region along line B-B of FIG. 23A.
Figure 24A:
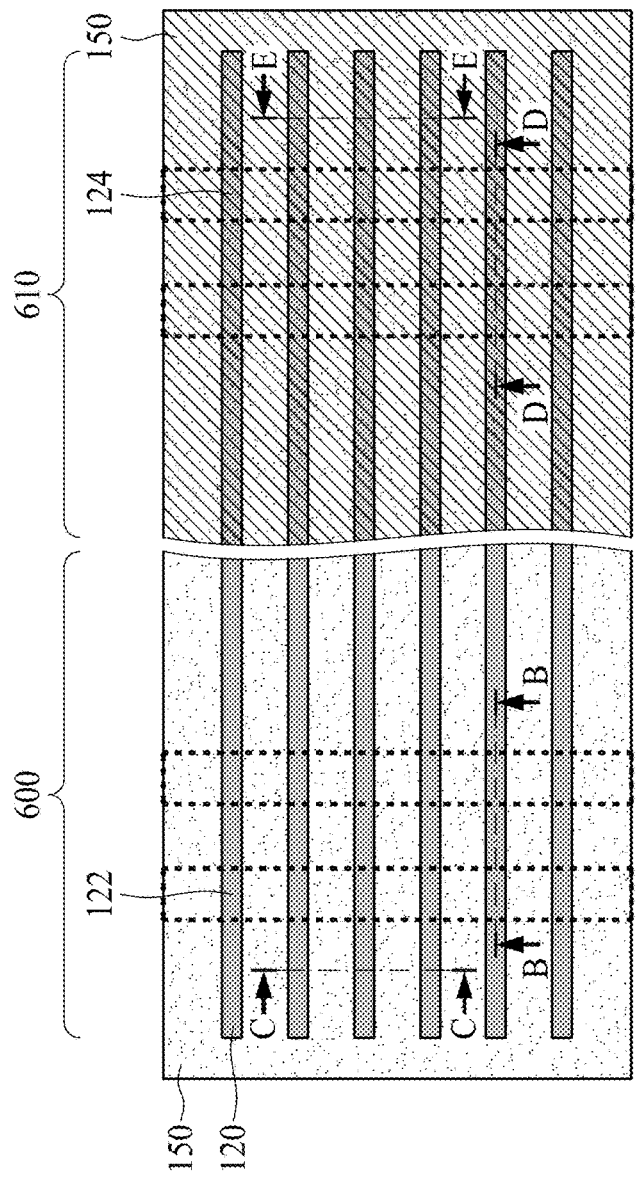
FIG. 24A is a plan view of the set of grooved fins, showing application of a mask to the normal region and a subsequent first etching that affects only the capacitor region.
Figure 24B:
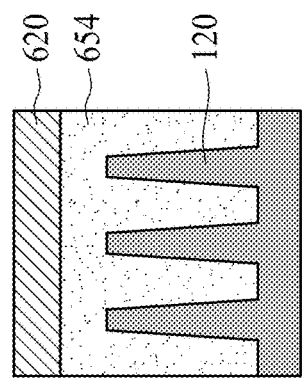
FIG. 24B is a longitudinal side cross-sectional view of the capacitor region along line B-B of FIG. 24A.
Figure 24C:
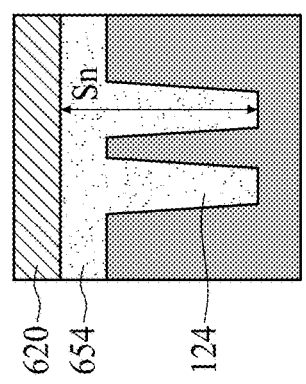
FIG. 24C is a lateral side cross-sectional view of the capacitor region along line C-C of FIG. 24A.
Figure 24D:
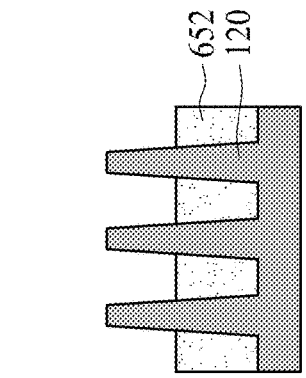
FIG. 24D is a longitudinal side cross-sectional view of the normal region along line D-D of FIG. 24A.
Figure 24E:
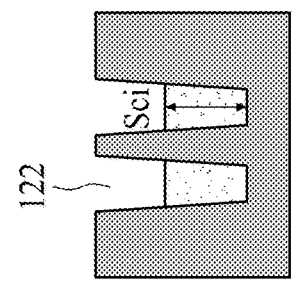
FIG. 24E is a lateral side cross-sectional view of the normal region along line E-E of FIG. 24A.

Beginning with FIGS. 22A-22E, the fins 120 are shown. The fins extend across both the capacitor region 600 and the normal region 610, as seen in FIG. 22A. it is contemplated that the fin length, fin width, and fin height/depth are the same in both regions.

Grooves 122 are present in the capacitor region, and grooves 124 are also present in the normal region. The grooves in the capacitor region have depth Dc and length Lc. The grooves in the normal region have depth Dn and length Ln. As illustrated here, the two depths Dc, Dn are equal, and the two lengths Lc, Ln are also equal. The longitudinal side cross-sectional views and the lateral side cross-sectional views are the same for both regions, as seen in FIGS. 22B-22E.

In other embodiments, it is contemplated that the depth Dc is greater than the depth Dn and/or the length Lc is greater than the depth Ln. As a result, the surface area of the grooves 122 in the capacitor region is greater than the surface area of the grooves 124 in the normal region. Again, it is noted that the two lengths Lc, Ln are also less than or equal to the fin width W0. The groove depth Dc of the grooves in the capacitor region can be made different from the groove depth Dn of the grooves in the capacitor region, for example, by applying a mask (e.g. photoresist) to expose one region and not the other region, so that only the grooves in the exposed region are etched. This permits the groove depth to be independently controlled.

Next, in FIGS. 23A-23E, an STI layer 150 is deposited over the fins. The STI layer also fills the grooves 122, 124 in both regions. The portion of the STI layer in the capacitor region is marked with reference numeral 652, and the portion of the STI layer in the capacitor region is marked with reference numeral 654.

Then, in FIGS. 24A-24E, a mask 620 (for example, photoresist) is applied to only the normal region 610 and not the capacitor region 600. The STI layer 150 is then etched. Due to the presence of the mask, only the STI layer in the capacitor region 652 is etched. As a result, the depth of the STI layer in the capacitor region 652 is less than the depth of the STI layer in the normal region 654. This intermediate depth of the STI layer in the capacitor region is indicated as Sci, while the depth of the STI layer in the normal region is indicated as Sn.

The mask 620 is then removed, resulting in the structure shown in FIGS. 25A-25E. In FIGS. 26A-26E, the STI layer 150 is etched again, reducing the thickness of the STI layer in both regions 652, 654, so that the fins are exposed in both regions. The final depths of the STI layer in each region are now indicated as depths Scf, Snf.

FIGS. 27A-27E illustrate the two regions after the dielectric layer 180, gate spacers 170, gate oxide layer 192, and gate layer 194 have been deposited and patterned to form a first gate stack 660 in the capacitor region and a second gate stack 670 in the normal region, thus forming two separate transistors, one in each region. As seen in the plan view of FIG. 27A, the dielectric layer 180 electrically isolates the two transistors from each other. The fins 120 are shown as dashed lines. As seen by comparing FIGS. 27B-27C with FIGS. 27D-27E, the transistor in the capacitor region has a higher capacitance than the transistor in the normal region, due to the higher overlapping surface area between the fins 120 and the first gate stack 660.

Figure 28A:
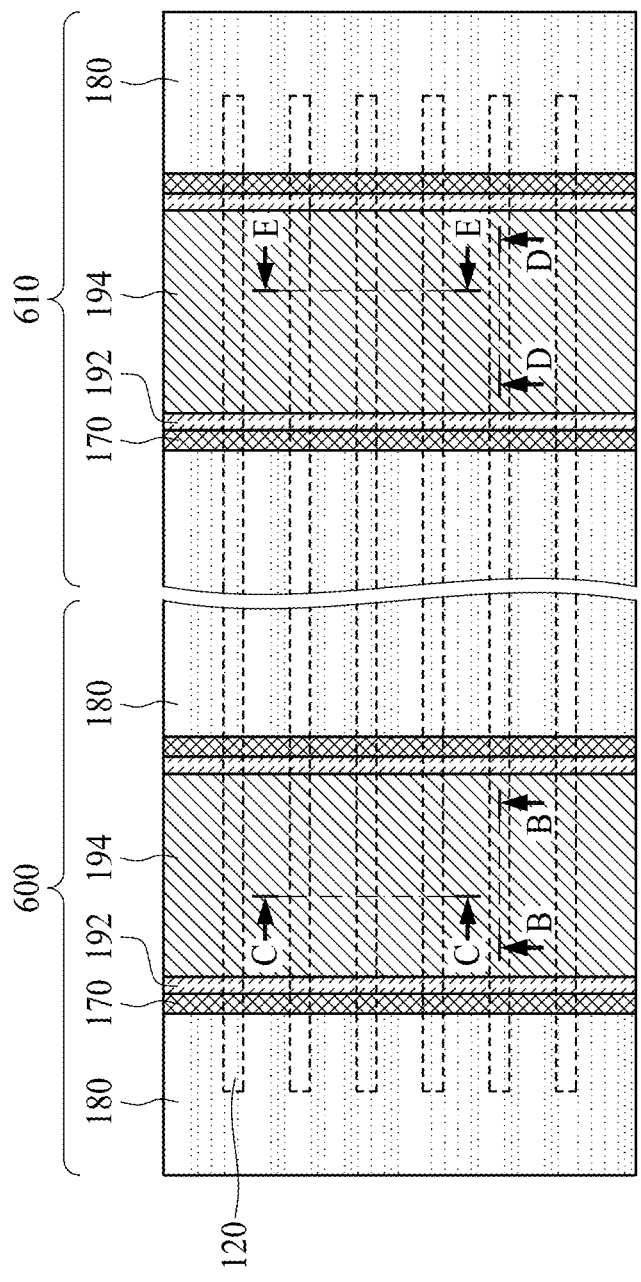
FIG. 28A is a plan view of a fourth embodiment of a completed transistor, where grooves are only present in the capacitor region and not the normal region, in accordance with some embodiments.
Figure 28E:
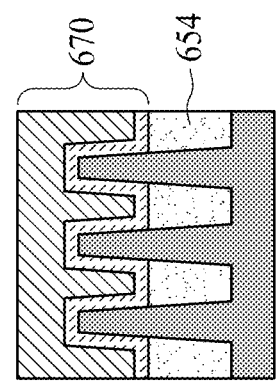
FIG. 28E is a lateral side cross-sectional view of the normal region along line E-E of FIG. 28A.
Figure 28D:
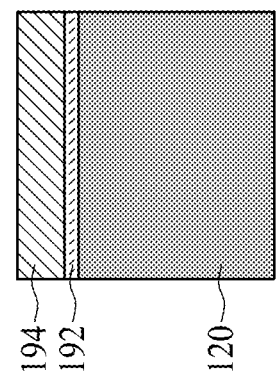
FIG. 28D is a longitudinal side cross-sectional view of the normal region along line D-D of FIG. 28A.
Figure 28C:
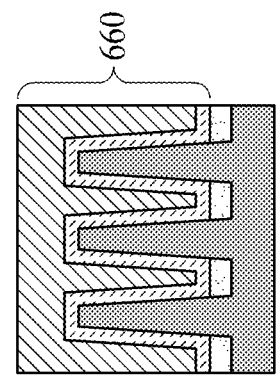
FIG. 28C is a lateral side cross-sectional view of the capacitor region along line C-C of FIG. 28A.
Figure 28B:
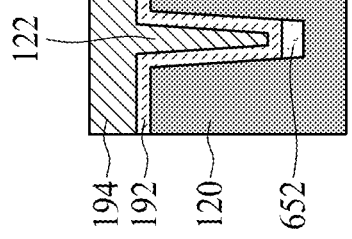
FIG. 28B is a longitudinal side cross-sectional view of the capacitor region along line B-B of FIG. 28A.
Figure 29:
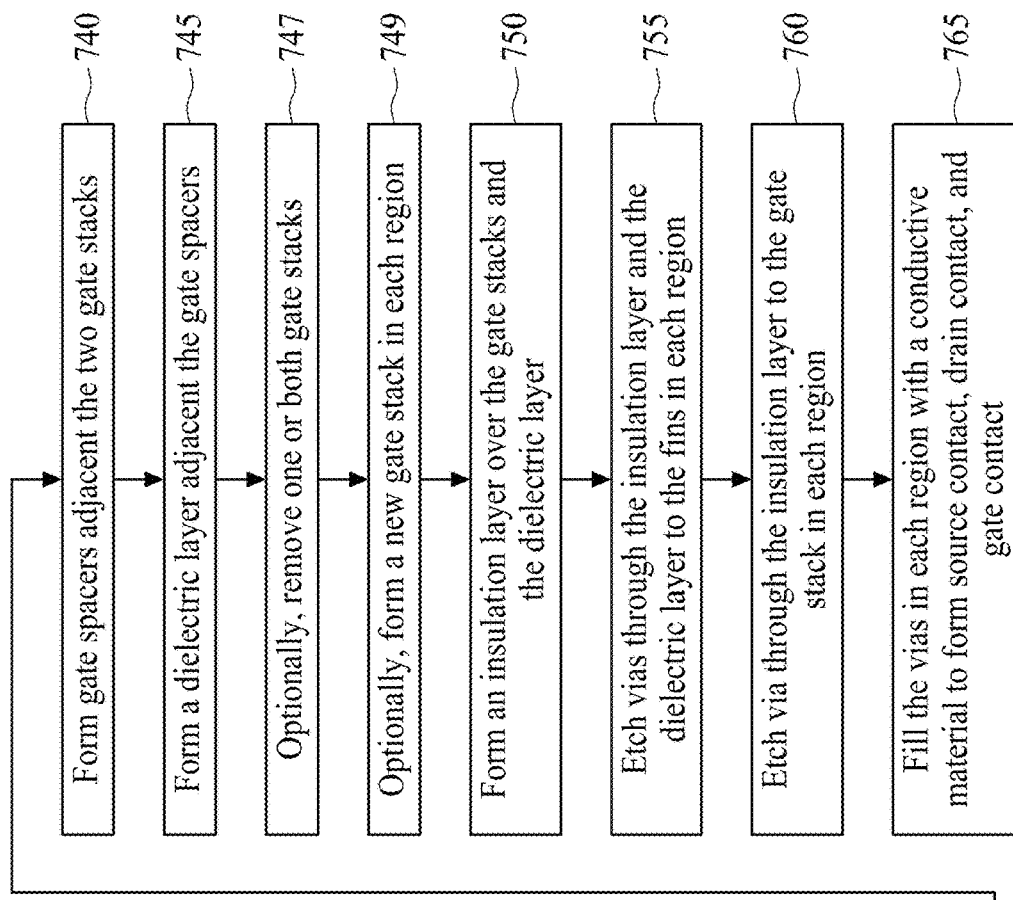
FIG. 29 is a flowchart showing the steps in a method for forming the third and fourth embodiments of a semiconductor device, in accordance with some embodiments herein.

FIGS. 28A-28E illustrate the fourth method for forming a semiconductor device. The device of FIGS. 28A-28E differs from that of FIGS. 27A-27E in that no grooves are present in the fins in the normal region 610, as best seen in FIG. 28D. Again, the result of this structure is that the transistor in the capacitor region has a higher capacitance than the transistor in the normal region. This device can be formed by omitting the creation of grooves in the portions of the fins located in the normal region.

The devices of FIGS. 27A-28E, having transistors with different capacitances, may act as a CMOS circuit. This may be useful for chips used in image processing or other applications.

In additional embodiments, other structures can be changed between the capacitor region and the normal region to change their capacitances. As already described, the grooves between the two regions could have different depths, or have STI layers with different depths. As another example, it is contemplated that the gate oxide layer in the capacitor region and the normal region can be different from each other. For example, the two gate oxide layers could be made from different materials that have a different dielectric constant, or the two gate oxide layers could have different thicknesses. As yet another example, the fins in the two regions could have different doping concentrations, and/or use different dopants.

FIG. 29 is a flowchart summarizing the various steps illustrated in FIGS. 22A-28E.

In step 705, a substrate with at least one fin is received. The substrate usually has a plurality of fins thereon. At least one groove is present in the fin, which extends across the entire width of the fin. As illustrated in FIGS. 22A-22E, a plurality of grooves is present, with at least a first groove in a capacitor region and a second groove in a normal region.

In optional step 707, ion implantation is performed on the fin(s). It is noted that the ions implanted in the capacitor region and the normal region may be the same, or may be different. In more particular embodiments, it is contemplated that one region is doped with a p-type dopant and the other region is doped with an n-type dopant. This step corresponds to that previously illustrated in FIGS. 5A-5C, and is not illustrated again.

In step 710, an STI layer is applied to the substrate. The STI layer may cover the fins, and is present in both the capacitor region and the normal region. This is illustrated in FIGS. 23A-23E. In step 715, a mask is applied to only the normal region. A mask is not applied to the capacitor region, so the STI layer in the capacitor region remains exposed. In step 720, the STI layer in the capacitor region is etched to an intermediate depth. This is illustrated in FIGS. 24A-24E.

In step 725, the mask is removed. This is illustrated in FIGS. 25A-25E. In step 730, the STI layer is etched again. This etching reduces the depth of the STI layer in both the capacitor region and the normal region, so that the fins are exposed. This is illustrated in FIGS. 26A-26E.

Next, in step 735, a first gate stack is formed in the capacitor region, which fills the fin groove(s) present in the capacitor region. A second gate stack is also formed in the normal region, which fills any fin groove(s) present in the normal region (compare FIGS. 27D-27E with FIGS. 28D-28E). In step 740, gate spacers are formed adjacent the two gate stacks. In step 745, a dielectric layer is formed adjacent the gate spacers, such that the gate spacers separate the dielectric layer from the two gate stacks. These steps correspond to those previously illustrated in FIGS. 8A-9C, and are not illustrated again.

In optional step 747, one or both gate stacks are removed. In optional step 749, one or two new gate stacks are formed. The new gate stacks may comprise a gate oxide layer and a metal gate layer. Again, these steps are optional, and the original gate stacks may be maintained within the final semiconductor device if desired. These steps correspond to those previously illustrated in FIGS. 10A-11C, and are not illustrated again.

In step 750, an insulation layer is formed over the two gate stacks and the dielectric layer. In step 755, vias are etched through the insulation layer and the dielectric layer in both the capacitor region and the normal region, exposing portions of the fin(s). In step 760, vias are etched through the insulation layer, exposing a portion of the gate stack in both the capacitor region and the normal region. In step 765, the vias are filled with an electrically conductive material to form contacts for the source terminal, the drain terminal, and the gate terminal. The steps for forming the contacts 755, 760, 765 can be performed in any order. These steps correspond to those previously illustrated in FIGS. 12A-12C (suitably modified), and are not illustrated again.

The semiconductor devices described herein, having fins with grooves across the fin width, provide higher capacitance compared to fins without such grooves. This provides the advantage of being able to independently control the capacitance without having to change the fin height or change the overall chip area. In addition, the grooves can be made without needing to add extra processing steps to the overall chip manufacturing process. Additional parameters, such as by changing the presence or depth of an STI layer within the grooves, or by varying properties of the gate oxide layer, can also be used to provide further control over the capacitance.

Some embodiments of the present disclosure thus relate to semiconductor devices. The devices comprise a substrate that comprises at least one fin. The fin has at least a first groove across a width of the fin. A first gate stack is disposed over the at least one fin, and fills the first groove. A first source and a first drain are each electrically connected to the at least one fin.

Also disclosed in various embodiments are methods for forming a semiconductor capacitor device. A fin is formed on a substrate. A mask with a pattern across a width of the fin is then applied. The fin is etched to form at least a first groove across the width of the fin. The mask is removed. A first gate stack is formed in the first groove of the fin.

Other embodiments disclosed herein include other methods for forming a semiconductor capacitor device. A first mask with a pattern is applied to a substrate. The first mask pattern comprises a spacer line that includes at least one gap, wherein the length of each gap is less than or equal to the width of the spacer line. The substrate is then etched to form a fin with at least one groove across the width of the fin. The first mask is then removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate comprising at least one fin, wherein the fin comprises at least a first groove across an entire width of the fin and a second groove across the width of the fin, wherein the first groove and the second groove each include an STI layer, wherein the depths of the STI layers differ from each other;
   a first gate stack disposed over the at least one fin, wherein the first gate stack fills the first groove; and a first source and a first drain, each electrically connected to the at least one fin along a length of the fin;

wherein the first gate stack, the first source, the first drain, and the at least one fin form a transistor.

2. The semiconductor device of claim 1, wherein the first groove has a length that is less than or equal to the width of the at least one fin.

3. The semiconductor device of claim 1, wherein the first groove has a depth that is deeper or shallower than a height of the at least one fin.

4. The semiconductor device of claim 1, wherein in a longitudinal side cross-sectional view, the first groove has a triangular or trapezoidal or rectangular shape.

5. The semiconductor device of claim 1, wherein the first groove and the second groove have different depths.

6. The semiconductor device of claim 1, wherein the at least one fin passes through a capacitor region and a normal region, and the first groove is in the capacitor region; and wherein a second gate stack is formed in the normal region which is electrically isolated from the first gate stack.

7. The semiconductor device of claim 6, wherein an STI layer in the capacitor region has a different depth than an STI layer in the normal region.

8. The semiconductor device of claim 6, wherein a gate oxide layer of the first gate stack is different from a gate oxide layer of the second gate stack.

9. The semiconductor device of claim 1, wherein the first gate stack comprises a gate oxide layer and a gate layer.

10. The semiconductor device of claim 1, further comprising gate spacers adjacent the first gate stack.

11. A semiconductor capacitor device formed by a method comprising:
    receiving a substrate with at least one fin;
    applying a first mask with a pattern across an entire width of the at least one fin; and
    etching the at least one fin to form at least a first groove across the entire width of the at least one fin;
    removing the first mask;
    depositing an STI layer;
    etching the STI layer so that the at least one fin is exposed;
    applying a second mask that exposes the at least one groove;
    etching the STI layer so that the STI layer in the at least one groove is shallower than the STI layer at the ends of the at least one fin; and
    removing the second mask;
    forming a first gate stack that fills the first groove of the at least one fin;
    forming a first source electrically connected to the at least one fin along a length of the fin; and
    forming a first drain electrically connected to the at least one fin along the length of the fin;
    wherein the first gate stack controls current flow through the at least one fin between the first source and the first drain.

12. The semiconductor capacitor device of claim 11, wherein the method further comprises implanting ions into the fin prior to forming the first gate stack.

13. The semiconductor capacitor device of claim 11, wherein the first groove has a length that is less than or equal to the width of the at least one fin.

14. The semiconductor capacitor device of claim 11, wherein the first gate stack comprises a gate oxide layer and a gate layer.

15. The semiconductor capacitor device of claim 11, wherein the first groove has a depth that is deeper or shallower than a height of the at least one fin.

16. The semiconductor capacitor device of claim 11, wherein in a longitudinal side cross-sectional view, the first groove has a triangular or trapezoidal or rectangular shape.

17. A semiconductor capacitor device, formed by a method comprising:
    applying a first mask with a pattern to a substrate, wherein the first mask pattern comprises a spacer line that includes at least one gap, wherein a length of each gap is less than or equal to a width of the spacer line;
    etching the substrate to form at least one fin comprising at least a first groove across an entire width of the fin;
    removing the first mask;
    depositing an STI layer;
    etching the STI layer so that the at least one fin is exposed;
    applying a second mask that exposes the at least one groove;
    etching the STI layer so that the STI layer in the at least one groove is shallower than the STI layer at the ends of the at least one fin; and
    removing the second mask;
    forming a first gate stack that fills the first groove of the at least one fin;
    forming a first source electrically connected to the at least one fin along a length of the fin;
    forming a first drain electrically connected to the at least one fin along the length of the fin;
    forming an insulation layer above the first gate stack; and
    forming electrical contacts that pass through the insulation layer to the first gate stack, the first source, and the first drain;
    wherein the first gate stack controls current flow through the at least one fin between the first source and the first drain.

18. The semiconductor capacitor device of claim 17, wherein the first gate stack comprises a gate oxide layer and a gate layer.

19. The semiconductor capacitor device of claim 17, wherein the first groove has a depth that is deeper or shallower than a height of the at least one fin.

20. The semiconductor capacitor device of claim 17, wherein in a longitudinal side cross-sectional view, the first groove has a triangular or trapezoidal or rectangular shape.

* * * * *